US011296018B2

(12) United States Patent
Oh

(10) Patent No.: US 11,296,018 B2
(45) Date of Patent: *Apr. 5, 2022

(54) DISPLAY DEVICE HAVING CONNECTION UNIT

(71) Applicant: Samsung Display Co., Ltd., Yongin-si (KR)

(72) Inventor: Myongsoo Oh, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/929,039

(22) Filed: Jul. 14, 2020

(65) Prior Publication Data

US 2020/0343171 A1 Oct. 29, 2020

Related U.S. Application Data

(63) Continuation of application No. 15/680,153, filed on Aug. 17, 2017, now Pat. No. 10,734,315.

(30) Foreign Application Priority Data

Sep. 6, 2016 (KR) .................. 10-2016-0114329

(51) Int. Cl.
*H01L 23/498* (2006.01)
*H01L 27/32* (2006.01)
(Continued)

(52) U.S. Cl.
CPC .... *H01L 23/49838* (2013.01); *G02F 1/13452* (2013.01); *H01L 23/49811* (2013.01);
(Continued)

(58) Field of Classification Search
CPC ........... H01L 23/49838; H01L 27/3223; H01L 23/49811; H01L 25/18; H01L 27/124; H01L 27/3276; H01L 27/3248
See application file for complete search history.

(56) References Cited

U.S. PATENT DOCUMENTS 7,256,858 B2 8/2007 Yun et al.
7,652,356 B2 1/2010 Shiki
(Continued)

FOREIGN PATENT DOCUMENTS

CN 101174606 5/2008
CN 105427784 3/2016
(Continued)

OTHER PUBLICATIONS

Non-Final Office Action dated on Jul. 10, 2019, issued in U.S. Appl. No. 15/680,153.
(Continued)

*Primary Examiner* — Eugene Lee
(74) *Attorney, Agent, or Firm* — H.C. Park & Associates, PLC

(57) ABSTRACT

A display device includes: a substrate; a pixel connected to a gate line and a data line on the substrate; a connection unit connected to one of the gate line and the data line of the substrate; and a driving integrated circuit mounted on the connection unit. The connection unit includes: a lead line connected to the driving integrated circuit; and a first dummy line adjacent to a first side of the connection unit, the first side intersecting a side of the substrate, the first side extending in a first direction, the first dummy line extending in a second direction intersecting the first direction. The side of the substrate overlaps the connection unit, and a third side of the connection unit overlaps the substrate without intersecting the side of the substrate, the third side extending in the second direction. The first dummy line is disposed between the side of the substrate and the third side of the connection unit.

20 Claims, 22 Drawing Sheets

(51) Int. Cl.

| | | |
|---|---|---|
| *G02F 1/1345* | (2006.01) | |
| *H01L 23/00* | (2006.01) | |
| *H01L 25/18* | (2006.01) | |
| *H01L 25/00* | (2006.01) | |
| *H01L 27/12* | (2006.01) | |
| *H01L 51/52* | (2006.01) | |
| *G02F 1/1362* | (2006.01) | |
| *G02F 1/1368* | (2006.01) | |

(52) U.S. Cl.
CPC .............. *H01L 24/32* (2013.01); *H01L 24/83* (2013.01); *H01L 25/18* (2013.01); *H01L 25/50* (2013.01); *H01L 27/124* (2013.01); *H01L 27/3223* (2013.01); *H01L 27/3276* (2013.01); *G02F 1/1368* (2013.01); *G02F 1/136286* (2013.01); *H01L 27/3248* (2013.01); *H01L 51/5253* (2013.01); *H01L 2224/32145* (2013.01); *H01L 2224/83192* (2013.01); *H01L 2224/83201* (2013.01); *H01L 2924/14* (2013.01); *H01L 2924/1426* (2013.01); *H01L 2924/15192* (2013.01)

(56) References Cited

U.S. PATENT DOCUMENTS

| | | |
|---|---|---|
| 7,982,844 B2 | 7/2011 | Lee |
| 8,542,161 B2 | 9/2013 | Chiang et al. |
| 8,670,100 B2 | 3/2014 | Koh |
| 9,342,177 B2 | 5/2016 | Seo et al. |
| 10,008,444 B2 | 6/2018 | Seo |
| 10,324,319 B2 | 6/2019 | Lee et al. |
| 10,734,315 B2 * | 8/2020 | Oh ....................... H01L 27/3276 |
| 2007/0138414 A1 | 6/2007 | Stevens et al. |
| 2008/0158124 A1 | 7/2008 | Kim |
| 2011/0244752 A1 | 10/2011 | Lee |
| 2014/0139413 A1 | 5/2014 | Kwon et al. |
| 2014/0146260 A1 | 5/2014 | Lee |
| 2014/0175977 A1* | 6/2014 | Yoon ..................... G09G 3/3208 315/51 |
| 2016/0079153 A1* | 3/2016 | Seo ........ G02F 1/1309 257/668 |
| 2016/0125792 A1 | 5/2016 | Lee et al. |
| 2020/0150479 A1* | 5/2020 | Kim ..................... G02F 1/1368 |
| 2020/0194461 A1* | 6/2020 | Park ..................... H01L 27/124 |

FOREIGN PATENT DOCUMENTS

| | | |
|---|---|---|
| JP | 2003273476 | 9/2003 |
| KR | 1998-0045325 | 9/1998 |
| KR | 2007-0102238 | 10/2007 |
| KR | 10-2008-0001831 | 1/2008 |
| KR | 10-2008-0008617 | 1/2008 |
| KR | 10-2008-0060442 | 4/2008 |
| KR | 2011-0072043 | 6/2011 |
| KR | 10-1422746 | 7/2014 |

OTHER PUBLICATIONS

Final Office Action dated Dec. 3, 2019, issued in U.S. Appl. No. 15/680,153.

Notice of Allowance dated Mar. 27, 2020, issued in U.S. Appl. No. 15/680,153.

* cited by examiner

DISPLAY DEVICE HAVING CONNECTION UNIT

CROSS-REFERENCE TO RELATED APPLICATIONS

This U.S. non-provisional patent application is a Continuation of U.S. patent application Ser. No. 15/680,153, filed Aug. 17, 2017, which claims priority to and the benefit of Korean Patent Application No. 10-2016-0114329, filed on Sep. 6, 2016, which is hereby incorporated by reference for all purposes as if fully set forth herein.

BACKGROUND

Field

The invention relates generally to display devices, more particularly, to display devices that may be produced at reduced manufacturing costs and can substantially prevent detachment of a connection unit on which a driving integrated circuit is mounted.

Discussion of the Background

A liquid crystal display ("LCD") device is a type of a flat panel display ("FPD") device, which has widely used recently. An LCD device generally includes two substrates on which electrodes are formed with a liquid crystal layer interposed therebetween.

Upon applying voltage to two electrodes, liquid crystal molecules of the liquid crystal layer are rearranged such that an amount of transmitted light is controlled in the LCD device.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Display devices constructed according to the principles of the invention provide connection units that reduce manufacturing costs, improve the attachment between the connection unit on which a driving integrated circuit is mounted and a substrate of a display panel, and substantially prevent detachment of the connection unit. For example, dummy lines may be provided in the connection unit to enhance the spreading of an adhesive film to securely attach the connection unit to the substrate of the display.

Additional aspects will be set forth in the detailed description which follows, and, in part, will be apparent from the disclosure, or may be learned by practice of the inventive concepts.

According to one aspect of the invention, a display device includes: a substrate; a pixel connected to a gate line and a data line on the substrate; a connection unit connected to one of the gate line and the data line of the substrate; and a driving integrated circuit mounted on the connection unit. The connection unit includes: a lead line connected to the driving integrated circuit; and at least one first dummy line adjacent to a first side of the connection unit intersecting a side of the substrate, the first dummy line not connected to any line of the connection unit including the driving integrated circuit and the lead line.

The first dummy line may have an end portion at the first side of the connection unit.

The first dummy line may extend from the first side of the connection unit toward another side of the connection unit.

An angle between the first dummy line and the first side of the connection unit may be about 90 degrees.

A less angle of respective angles among the first dummy lines and the first side of the connection unit may be greater than about 0 degree and less than about 90 degrees.

The first dummy line may be between the substrate and a base layer of the connection unit.

An entire surface of the first dummy line facing the substrate may not be covered by a cover layer of the connection unit.

The display device may further include an anisotropic conductive film between at least a portion of the first dummy line and the substrate.

The first dummy lines may not be connected to one another.

The first dummy lines may be parallel to one another.

Each of the first dummy lines may have a substantially same length.

The first dummy lines may have a less length, as more adjacent to a third side of the connection unit, and the third side of the connection unit may overlap the substrate and may not intersect a side of the substrate.

Two adjacent ones of the first dummy lines may have a greater distance therebetween, as more adjacent to a third side of the connection unit, and the third side of the connection unit may overlap the substrate and may not intersect a side of the substrate.

The first dummy line may have a gradually decreasing width, as further away from the first side.

Respective distances among adjacent ones of the first dummy lines may be uniform.

The distance among adjacent ones of the first dummy lines may be in a range of about 15 µm to about 30 µm.

At least a portion of the end portion of the first dummy line may include a carbonized area.

An end portion of the first dummy line may be spaced apart from the first side at a predetermined distance.

The display device may further include at least one second dummy line adjacent to a second side of the connection unit facing the first side, the second dummy line not connected to any line of the connection unit including the driving integrated circuit and the lead line.

The second dummy line and the first dummy line may be symmetric to one another in shape.

According to another aspect of the invention, a display device includes: a substrate; a pixel connected to a gate line and a data line on the substrate; a connection unit is connected to one of the gate line and the data line of the substrate; and a driving integrated circuit mounted on the connection unit. The connection unit includes: a lead line connected to the driving integrated circuit; and a first dummy line adjacent to a first side of the connection unit, the first side intersecting a side of the substrate, the first side extending in a first direction, the first dummy line extending in a second direction intersecting the first direction. The side of the substrate overlaps the connection unit, and a third side of the connection unit overlaps the substrate without intersecting the side of the substrate, the third side extending in the second direction. The first dummy line is disposed between the side of the substrate and the third side of the connection unit.

The first dummy line may have an end portion at the first side of the connection unit.

The first dummy line may extend from the first side of the connection unit toward another side of the connection unit.

An angle between the first dummy line and the first side of the connection unit may be about 90 degrees.

The smallest angle of respective angles among the first dummy lines and the first side of the connection unit may be greater than about 0 degree and less than about 90 degrees.

The first dummy line may be between the substrate and a base layer of the connection unit.

An entire surface of the first dummy line facing the substrate may be not covered by a cover layer of the connection unit.

The display device may further include an anisotropic conductive film between at least a portion of the first dummy line and the substrate.

The first dummy line may include a plurality of first lines, the plurality of first lines not being connected to one another.

The first dummy line may include a plurality of first lines, the plurality of first lines being substantially parallel to one another.

The first dummy line may include a plurality of first lines, each of the first lines having substantially the same length.

The first dummy line may include a plurality of first lines, the plurality of first lines having a reduced length, as the first lines become closer to the third side of the connection unit.

The first dummy line may include a plurality of first lines, two adjacent ones of the first lines having a greater distance therebetween, as the first lines become closer to the third side of the connection unit.

The first dummy line may include a plurality of first lines, the plurality of first lines having a gradually decreasing width, as the first lines become further away from the first side.

The first dummy line may include a plurality of first lines, with respective distances among adjacent ones of the first lines being substantially uniform.

The first dummy line may be not connected to the driving integrated circuit nor the lead line.

At least a portion of the end portion of the first dummy line may include a carbonized area.

An end portion of the first dummy line may be spaced apart from the first side at a predetermined distance.

The display device may further include a second dummy line adjacent to a second side of the connection unit facing the first side, the second dummy line not being connected to any line of the connection unit comprising the driving integrated circuit and the lead line.

The second dummy line and the first dummy line may be substantially symmetrical to one another in shape.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
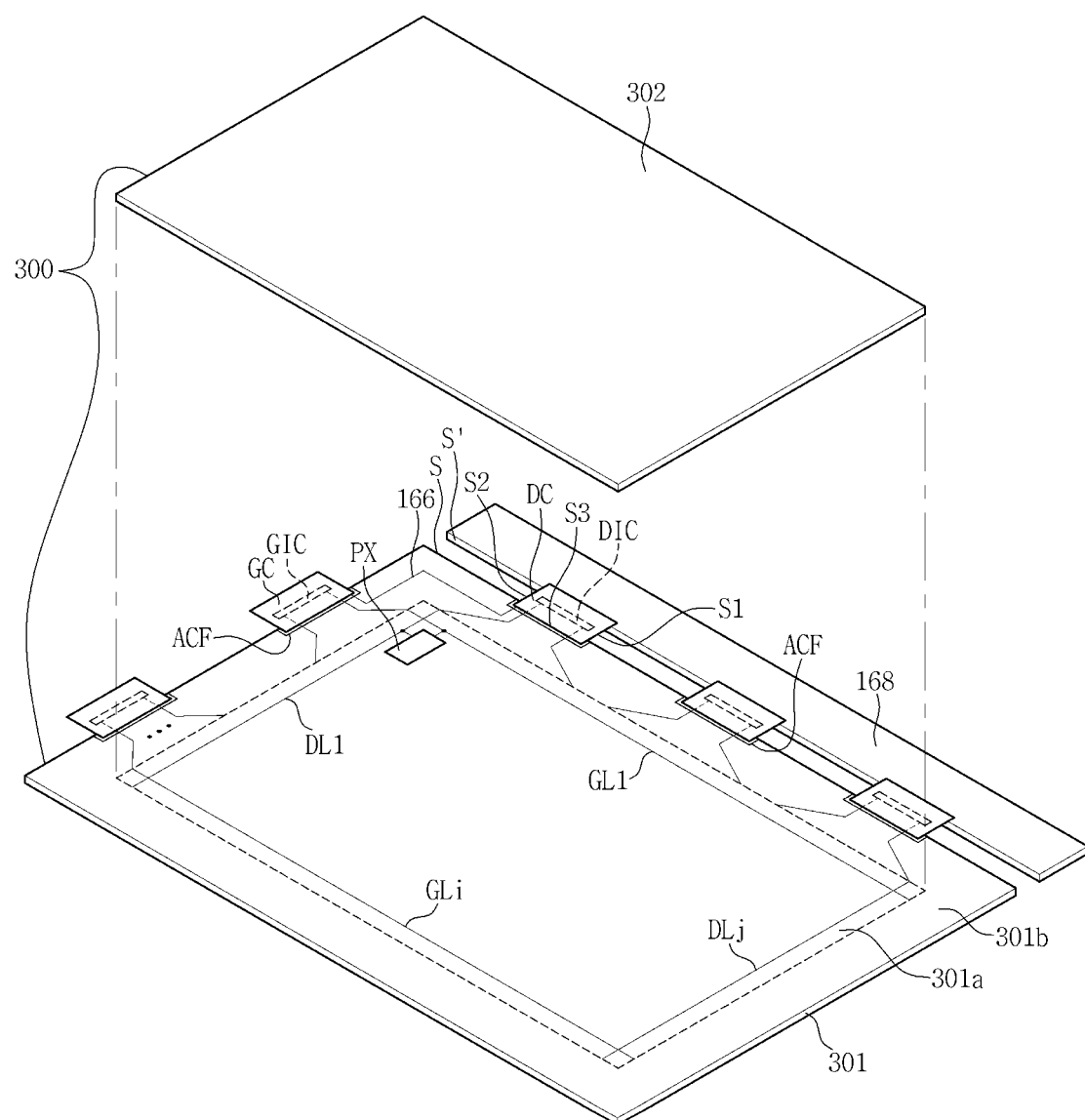
FIG. 1 is a perspective view of an embodiment of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
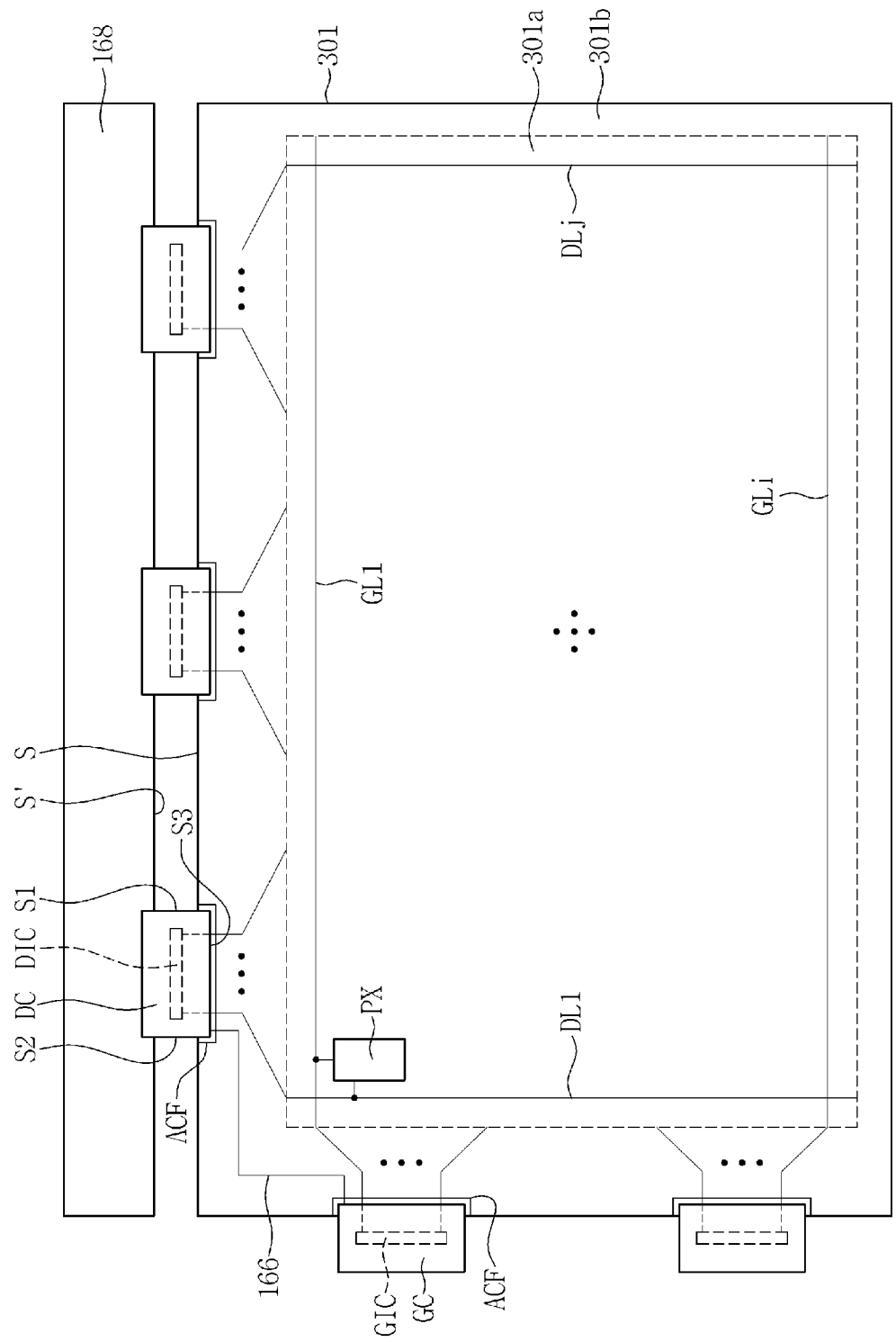
FIG. 2 is a plan view of a first substrate of the display device of FIG. 1.

FIG. 1 is a perspective view of an embodiment of a display device constructed according to the principles of the invention, and FIG. 2 is a plan view of a first substrate of the display device of FIG. 1.

As illustrated in FIG. 1, the display device according to an exemplary embodiment includes a display panel 300, a plurality of gate connection units GC, a plurality of gate driving integrated circuits ("ICs") GIC, a plurality of data connection units DC, a plurality of data driving ICs DIC, a plurality of gate lines GL1 to GLi, a plurality of data lines DL1 to DLj, and a printed circuit board ("PCB") 168.

The display panel 300 displays an image. The display panel 300, as illustrated in FIG. 1, includes a first substrate 301 and a second substrate 302.

A liquid crystal layer or an organic light emitting layer may be further disposed between the first substrate 301 and the second substrate 302.

The first substrate 301 has a display area 301a and a non-display area 301b. A plurality of pixels PXs is disposed in the display area 301a. Each of the pixels is connected to the gate line and the data line.

The pixel PX may include a switching element, a pixel electrode, and a common electrode. The switching element includes a gate electrode connected to the gate line, a source electrode connected to the data line, and a drain electrode connected to the pixel electrode. The switching element is also referred to as a thin film transistor ("TFT").

The common electrode may be disposed on the first substrate 301 or the second substrate 302, and the liquid crystal layer or the organic light emitting layer may be disposed between the common electrode and the pixel electrode. In an exemplary embodiment, the common electrode may be disposed on the first substrate 301.

In addition, the pixel PX may further include a color filter and a light blocking layer, and the color filter and the light blocking layer may be disposed on the first substrate 301 or the second substrate 302. The light blocking layer is also commonly referred to as a black matrix.

The plurality of gate lines GL1 to GLi are disposed in the display area 301a of the first substrate 301. Each of the gate lines GL1 to GLi extends to the non-display area 301b and is connected to corresponding one of the gate driving ICs GIC. In such an exemplary embodiment, the gate lines GL1 to GLi are connected to the gate driving ICs GIC through the gate connection units GC.

The plurality of data lines DL1 to DLj are disposed in the display area 301a of the first substrate 301. The data lines DL1 to DLj intersect the gate lines GL1 to GLi. Each of the data lines DL1 to DLj extends to the non-display area 301b and is connected to corresponding one of the data driving ICs DIC. In such an exemplary embodiment, the data lines DL1 to DLj are connected to the data driving ICs DIC through the data connection units DC.

The gate driving ICs GIC generate gate signals and apply the gate signals to the first to i-th gate lines GL1 to GLi sequentially.

The gate driving ICs GIC are mounted on the gate connection units GC. For example, the gate driving IC GIC may be mounted on the gate connection unit GC in a chip-on-film manner and may be electrically connected to the gate connection unit GC.

The gate connection units GC are electrically connected to the first substrate 301. For example, an input portion and an output portion of each gate connection unit GC may be electrically connected to a gate pad terminal of the first substrate 301. The gate pad terminal is disposed in the non-display area 301b of the first substrate 301. The gate connection unit GC may be a tape carrier package or other type of circuit package known in the art.

Each of the gate connection units GC may be physically and electrically connected to the first substrate 301 through an anisotropic conductive film ("ACF").

The data driving ICs DIC receive digital image data signals and a data control signal from a timing controller as is known in the art. The data driving ICs DIC sample the digital image data signals according to the data control signal, latch the sampled image data signals corresponding to one horizontal line in each horizontal period, and apply the latched image data signals to the data lines DL1 to DLj. That is, the data driving ICs DIC convert the digital image data signals applied from the timing controller into analog image signals using a gamma voltage input from a power supply, and apply the analog image signals to the data lines DL1 to DLj.

The data driving ICs DIC are mounted on the data connection units DC. The data driving IC DIC may be mounted on the data connection unit DC in a chip-on-film manner and may be electrically connected to the data connection unit DC.

The data connection units DC are connected between the PCB 168 and the first substrate 301. For example, an input portion of each data connection unit DC is electrically connected to a data pad terminal of the PCB 168, and an output portion of each data connection unit DC is electrically connected to a data pad terminal of the first substrate 301. The data pad terminal of the first substrate 301 is disposed in the non-display area 301b of the first substrate 301. The data connection unit DC may be a tape carrier package or other type of circuit package known in the art.

Each of the data connection units DC may be physically and electrically connected to the first substrate 301 through an ACF.

The timing controller and the power supply may be disposed on the PCB 168. The data connection unit DC includes input lead lines transmitting various signals applied from the timing controller and the power supply to the data driving IC DIC and output lead lines transmitting the image data signals output from the data driving IC DIC to the data lines DL1 to DLj.

In an exemplary embodiment, at least one data connection unit DC may further include auxiliary lead lines for transmitting various signals applied from the timing controller and the power supply to the gate driving ICs GIC, and the auxiliary lead lines are connected to panel lines 166 at the first substrate 301, as shown in FIG. 2. These panel lines 166 connect the auxiliary lead lines to the gate driving ICs GIC. The panel lines 166 may be disposed in the non-display area 301b of the first substrate 301 in a line-on-glass manner.

Figure 3:
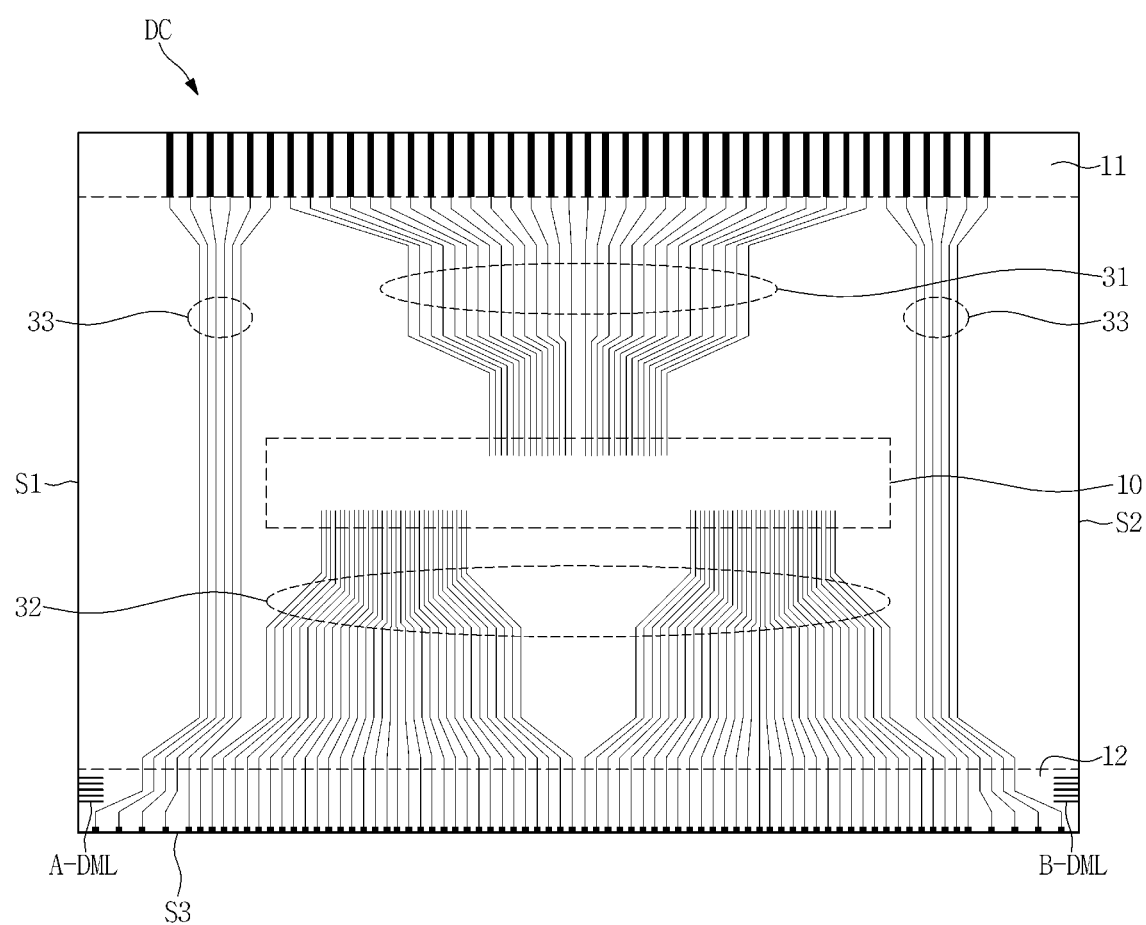
FIG. 3 is a detailed plan view of the rear surface of an embodiment of a data connection unit of the first substrate of FIG. 2 illustrating wire configurations.

FIG. 3 is a detailed plan view of the rear surface of an embodiment of a data connection unit of the first substrate of FIG. 2 illustrating wire configurations. Herein, FIG. 3 is a view illustrating a rear surface of the data connection unit DC illustrated in FIG. 2. In addition, the data driving IC DIC is not illustrated in FIG. 3 for clarity.

As illustrated in FIG. 3, the data connection unit DC includes a plurality of input lead lines 31, a plurality of output lead lines 32, a plurality of auxiliary lead lines 33, a mounting portion 10, an input portion 11, and an output portion 12.

The data driving IC DIC may be mounted in the mounting portion 10. The mounting portion 10 is disposed between the input portion 11 and the output portion 12.

The input portion 11 of the data connection unit DC is connected to the PCB 168 and the output portion 12 of the data connection unit DC is connected to the first substrate 301.

The input lead lines 31 of the data connection unit DC are connected to input terminals of the data driving IC DIC mounted on the mounting portion 10, respectively. Further, the input lead lines 31 are connected to data pad terminals of the PCB 168, respectively. For example, an end portion of the input lead line 31 is connected to the input terminal of the data driving IC DIC, and another end portion of the input lead line 31 is connected to the data pad terminal of the PCB 168.

The output lead lines 32 of the data connection unit DC are connected to output terminals (of the data driving IC DIC respectively mounted on the mounting portion 10. Further, the output lead lines 32 are connected to data pad terminals of the first substrate 301, respectively. For example, an end portion of the output lead line 32 is connected to the output terminal of the data driving IC DIC, and another end portion of the output lead line 32 is connected to the data pad terminal of the first substrate 301. The data pad terminal of the first substrate 301 is connected to the data line.

The auxiliary lead lines 33 of the data connection unit DC are connected to auxiliary pad terminals of the PCB 168. Further, the auxiliary lead lines 33 of the data connection unit DC are connected to auxiliary pad terminals of the first substrate 301. For example, an end portion of the auxiliary lead line 33 is connected to the auxiliary pad terminal of the PCB 168, and another end portion of the auxiliary lead line 33 is connected to the auxiliary pad terminal of the first substrate 301. The auxiliary pad terminal of the first substrate 301 may be connected to the panel line 166 described above.

Figure 4:
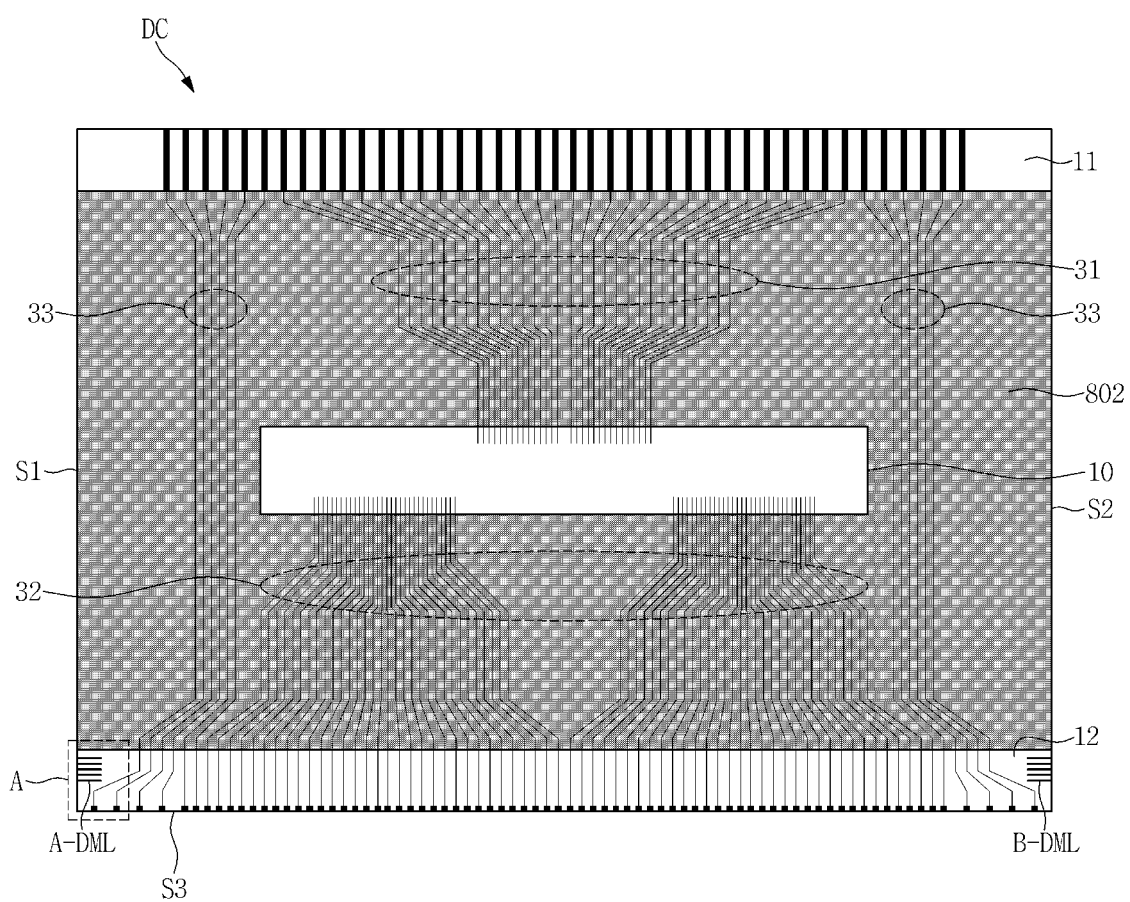
FIG. 4 is a detailed plan view of the data connection unit of FIG. 3 showing the configuration of a cover layer of the data connection unit.

FIG. 4 is a detailed plan view of the data connection unit of FIG. 3 showing the configuration of a cover layer of the data connection unit.

As illustrated in FIG. 4, the data connection unit DC may include a cover layer 802. The cover layer 802 may be disposed on the entire surface of the data connection unit DC except for the mounting portion 10, the input portion 11, and the output portion 12. In other words, boundaries of the cover layer 802 may define each of the mounting portion 10, the input portion 11, and the output portion 12. The cover layer 802 may be a solder resist.

An end portion of the input lead line 31 is connected to the input terminal of the data driving IC DIC through the mounting portion 10 defined by the cover layer 802, and another end portion of the input lead line 31 is connected to the data pad terminal of the PCB 168 through the input portion 11 defined by the cover layer 802.

An end portion of the output lead line 32 is connected to the output terminal of the data driving IC DIC through the mounting portion 10 defined by the cover layer 802, and another end portion of the output lead line 32 is connected to the data pad terminal of the first substrate 301 through the output portion 12 defined by the cover layer 802.

An end portion of the auxiliary lead line 33 is connected to the auxiliary pad terminal of the PCB 168 through the input portion 11 defined by the cover layer 802, and another end portion of the auxiliary lead line 33 is connected to the auxiliary pad terminal of the first substrate 301 through the output portion 12 defined by the cover layer 802.

Figure 5:
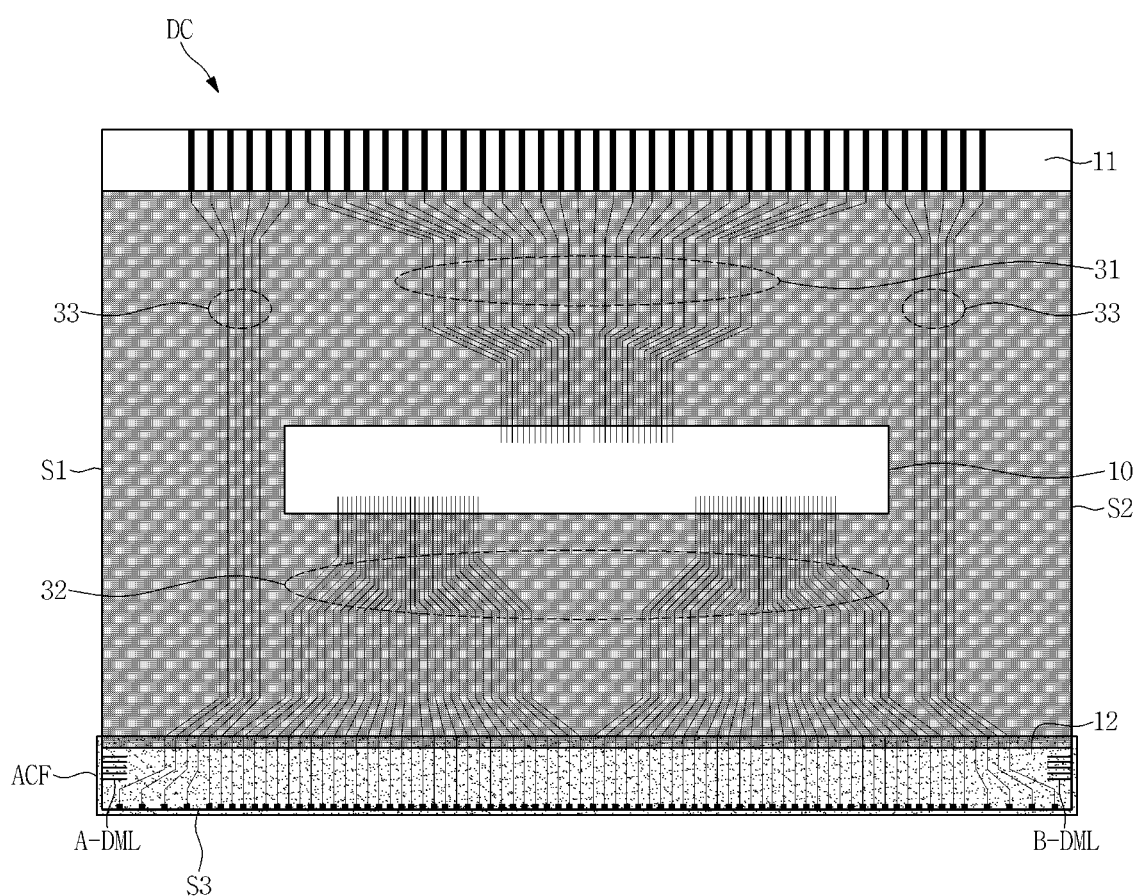
FIG. 5 is a detailed plan view of the data connection unit of FIG. 4 showing an anisotropic conductive film ("ACF") bonded to the data connection unit.

FIG. 5 is a detailed plan view of the data connection unit of FIG. 4 showing an anisotropic conductive film ("ASF") bonded to the data connection unit.

As illustrated in FIG. 5, the ACF may be disposed on the output portion 12 of the data connection unit DC. From a vertical perspective, the ACF may be disposed on the data connection unit DC between the output portion 12 of the data connection unit DC and the first substrate 301. In other words, the ACF may be disposed in an area overlapping the data connection unit DC and the first substrate 301.

In an exemplary embodiment, as illustrated in FIG. 2, each of two opposing sides S1 and S2 of the four sides of the data connection unit DC intersects one side S of the first substrate 301. Herein, one of the two opposing sides S1 and S2 of the data connection unit DC is defined as a first side S1, and the other thereof is defined as a second side S2. In such an exemplary embodiment, another side of the data connection unit DC disposed between the first side S1 and the second side S2 and overlapping the first substrate 301 is defined as a third side S3. The third side S3 does not intersect said one side S of the first substrate 301.

The first side S1 and the second side S2 of the data connection unit DC also intersect one side S' of the PCB 168. The one side S' of the PCB 168 and the one side S of the first substrate 301 face each other, as illustrated in FIG. 2.

The data connection unit DC includes at least one dummy line. As used herein a dummy line is any unconnected conductive portion disposed on, in, over or under a layer that serves some other purpose than conducting electrons to connect electrical components. As described in more detail below, the dummy lines herein serve to distribute the ACF to ensure a secure connection between the components. For example, as illustrated in FIG. 4, the data connection unit DC includes at least one dummy line A-DML (hereinafter, "A-dummy line") adjacent to the first side S1 thereof and at least one dummy line B-DML (hereinafter, "B-dummy line") adjacent to the second side S2 thereof.

The A-dummy lines A-DML and the B-dummy lines B-DML are disposed at the output portion 12 of the data connection unit DC. The A-dummy lines A-DML and the B-dummy lines B-DML are exposed outwardly of the data connection unit DC through the output portion 12.

Five A-dummy lines A-DML and five B-dummy lines B-DML are illustrated in FIG. 4, however, the number of the A-dummy lines A-DML and the number of the B-dummy lines are not limited thereto. In addition, the number of the A-dummy lines A-DML and the number of the B-dummy lines B-DML may be substantially the same or different from one another.

Figure 6:
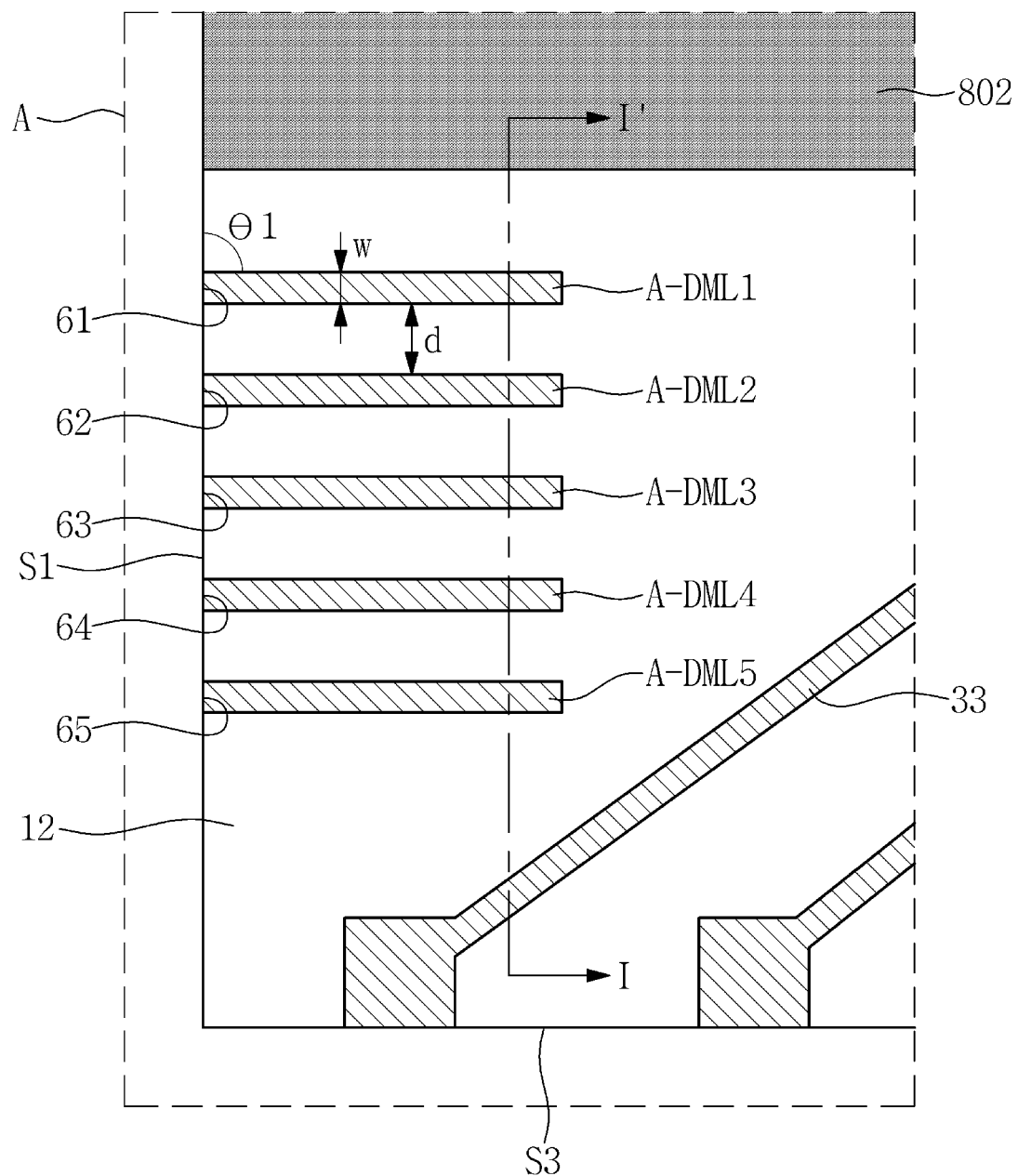
FIG. 6 is an enlarged schematic plan view of portion A of the data connection unit of FIG. 4 illustrating a first embodiment of dummy lines.

FIG. 6 is an enlarged schematic plan view of portion A of the data connection unit of FIG. 4 illustrating a first embodiment of dummy lines.

Each of the A-dummy lines A-DML1, A-DML2, A-DML3, A-DML4, and A-DML5 has an end portion disposed at the first side S1 of the data connection unit DC, as illustrated in FIG. 6. The A-dummy lines A-DML1, A-DML2, A-DML3, A-DML4, and A-DML5 have end portions 61, 62, 63, 64, and 65 disposed at different positions of the first side S1, respectively. For example, the end portion 61 of the first A-dummy line A-DML1 is disposed at the first side S1.

Each of the A-dummy lines A-DML1, A-DML2, A-DML3, A-DML4, and A-DML5 extends from the first side S1 of the data connection unit DC toward another side of the data connection unit DC. For example, each of the A-dummy lines A-DML1, A-DML2, A-DML3, A-DML4, and A-DML5 may extend from the first side S1 of the data connection unit DC toward the second side S2 thereof.

The angle between each of the A-dummy lines A-DML and the first side S1 of the data connection unit DC may be about 90 degrees. For example, an angle $\theta 1$ between the first A-dummy line A-DML1 and the first side S1 is about 90 degrees.

The A-dummy lines A-DML are substantially parallel to one another.

Respective widths of the A-dummy lines A-DML1, A-DML2, A-DML3, A-DML4, and A-DML5 may be substantially the same or different from one another. In an exemplary embodiment, the first A-dummy line A-DML1 may have a width w ranging from about 15 µm to about 30 µm, and other A-dummy lines A-DML2, A-DML3, A-DML4, and A-DML5 may have a width ranging from about 15 µm to about 30 µm. For example, a width w of each of the A-dummy lines may be about 25 µm.

The distance between adjacent ones of the A-dummy lines may be substantially the same or different from one another. In an exemplary embodiment, the distance d between the first A-dummy line A-DML1 and the second A-dummy line A-DML2 adjacent to the first A-dummy line A-DML1 may be in a range of between about 15 µm and 30 µm, and a distance between another adjacent ones of the A-dummy lines may be in a range of between about 15 µm and 30 µm. For example, the distance d between adjacent ones of the A-dummy lines may be about 25 µm.

The width w of the A-dummy line and the distance d between adjacent ones of the A-dummy lines may be substantially the same or different from one another as described hereinabove.

Each of the A-dummy lines A-DML has an shape that is isolated from and is not connected to any of terminals of the data driving IC DIC nor to any of lines of the data connection unit DC. In other words, each of the A-dummy lines A-DML is not physically nor directly connected to any signal line of the display device. Herein, the signal line includes all of the following lines: a line directly receiving a signal from a signal source, a line indirectly receiving a signal from the signal source through at least one other line, a line indirectly receiving a signal from the signal source through at least one capacitor, or a line indirectly receiving a signal from the signal source through at least one switch.

As an example, the first A-dummy line A-DML1 is not physically nor directly connected to the input terminals of the data driving IC DIC, the output terminals of the data driving IC DIC, the input lead lines 31 of the data connection unit DC, the output lead lines 32 of the data connection unit DC, the auxiliary lead lines 33 of the data connection unit DC, signal lines of the PCB 168, signal lines of the first substrate 301, and signal lines of the second substrate 302.

As described above, each of the A-dummy lines A-DML1, A-DML2, A-DML3, A-DML4, and A-DML5 is physically separated from other signal lines and has a floating state electrically.

The B-dummy lines may have substantially the same shape as the shape of the A-dummy lines described above.

For example, the B-dummy lines B-DML have end portions disposed at the second side S2 of the data connection unit DC, as illustrated in FIG. 4.

Each of the B-dummy lines B-DML extends from the second side S2 of the data connection unit DC toward another side of the data connection unit DC. For example, each of the B-dummy lines B-DML may extend from the second side S2 of the data connection unit DC toward the first side S1 thereof.

The angle between each of the B-dummy lines B-DML and the second side S2 of the data connection unit DC may be about 90 degrees.

The B-dummy lines B-DML are substantially parallel to one another.

Respective widths of the B-dummy lines B-DML may be substantially the same or different from one another. For example, a width w of at least one of the B-dummy lines B-DML may be about 25 μm.

A distance between adjacent ones of the B-dummy lines B-DML may be substantially the same or different from one another. For example, a distance between adjacent ones of the B-dummy lines B-DML may be about 25 μm, and a distance between another adjacent ones of the B-dummy lines B-DML may be about 25 μm.

The width w of the B-dummy line and the distance between adjacent ones of the B-dummy lines may be substantially the same or different from one another as described hereinabove.

Each of the B-dummy lines B-DML has a shape that is isolated from and is not connected to any of the terminals of the data driving IC DIC nor to any of the lines of the data connection unit DC. In other words, each of the B-dummy lines B-DML is not physically nor directly connected to any signal line of the display device. That is, similar to the aforementioned A-dummy lines, each B-dummy line B-DML is physically separated from another signal line and has a floating state electrically.

Figure 7:
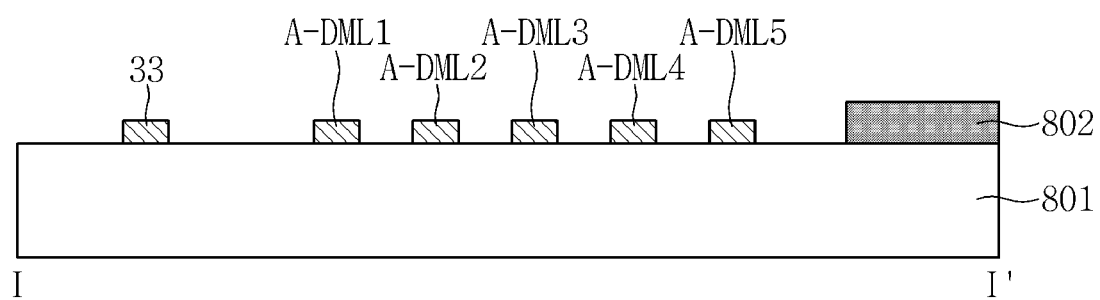
FIG. 7 is a cross-sectional view of the data connection unit of FIG. 6 taken along sectional line I-I' of FIG. 6.

FIG. 7 is a cross-sectional view of the data connection unit of FIG. 6 taken along sectional line I-I' of FIG. 6.

As illustrated in FIG. 7, the data connection unit DC further includes a base layer 801. The base layer 801 may include polyimide.

The A-dummy lines A-DML and the auxiliary lead lines 33 are disposed on the base layer 801 of the data connection unit DC. Although not illustrated in FIG. 7, the input lead lines 31, the output lead lines 32, and the B-dummy lines B-DML are also disposed on the base layer 801.

The A dummy lines A-DML lines, the auxiliary lead lines 33, the input lead lines 31, the output lead lines 32, and the B-dummy lines B-DML may be formed from substantially the same material. For example, The A dummy lines A-DML lines, the auxiliary lead lines 33, the input lead lines 31, the output lead lines 32, and the B-dummy lines B-DML may include copper (Cu).

In an exemplary embodiment, the cover layer 802 is disposed on the base layer 801. In addition, as illustrated in FIG. 4, the cover layer 802 is disposed on the input lead lines 31, the output lead lines 32, and the auxiliary lead lines 33 except for areas corresponding to the input portion 11, the output portion 12, and the mounting portion 10 of the data connection unit DC.

Figure 8A:
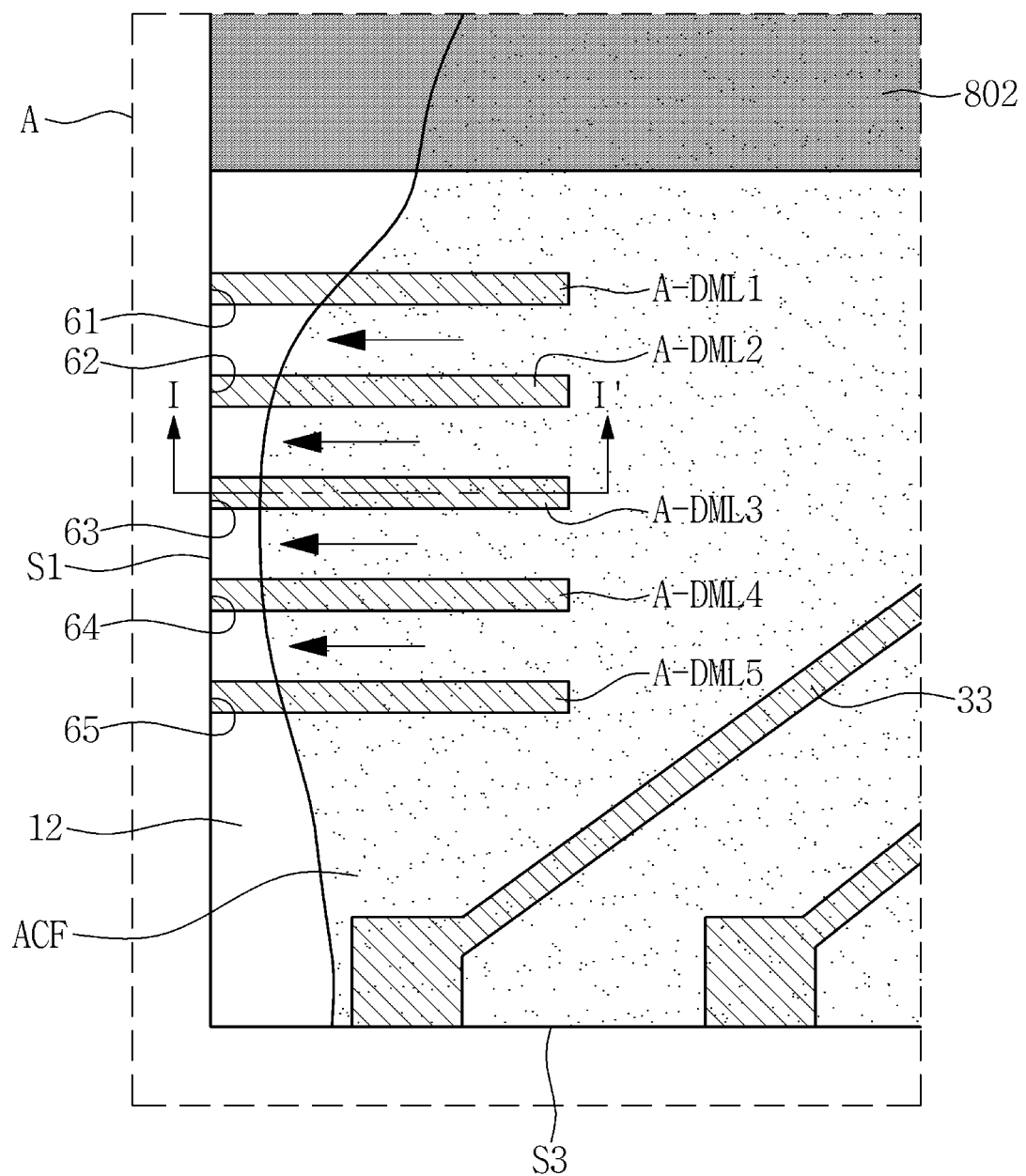
FIG. 8A is an enlarged schematic plan view of portion A of the data connection unit of FIG. 4 showing a flow of an anisotropic conductive film in the presence of a dummy line.
Figure 8B:
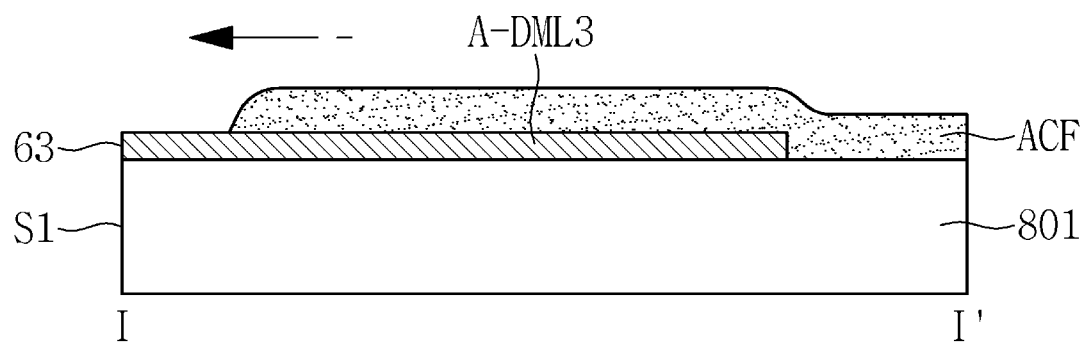
FIG. 8B is a cross-sectional view of the data connection unit of FIG. 8A taken along sectional line I-I' of FIG. 8A.

FIG. 8A is an enlarged schematic plan view of portion A of the data connection unit of FIG. 4 showing a flow of an anisotropic conductive film in the presence of a dummy line. FIG. 8B is a cross-sectional view of the data connection unit of FIG. 8A taken along sectional line I-I' of FIG. 8A.

As illustrated in FIGS. 8A and 8B, when pressure is applied to the ACF bonded to the data connection unit DC, the viscosity of the ACF decreases. Accordingly, the fluidity of the ACF increases. The ACF may smoothly move to one edge, i.e., the first side S1, of the data connection unit DC through the A-dummy lines A-DML1, A-DML2, A-DML3, A-DML4, and A-DML5. That is, since the A-dummy lines A-DML1, A-DML2, A-DML3, A-DML4, and A-DML5 have line shapes extending from the first side S1, the ACF is induced by the A-Dummy lines A-DML1, A-DML2, A-DML3, A-DML4, and A-DML5 to flow and spreads (diffuses) to the first side S1 along an outward direction shown by the arrows in FIG. 8A.

In addition, although not illustrated in FIG. 8A, the ACF may smoothly flow to another edge, i.e., the second side S2, of the data connection unit DC through the B-dummy lines B-DML. That is, since the B-dummy lines B-DML have line shapes extending from the second side S2, the ACF is induced by the B-dummy lines B-DML to flow and spreads (diffuses) to the second side S2.

FIGS. 9A to 9H are schematic perspective views of a data connection unit, a support, a pressing apparatus, a first laser irradiator, a second laser irradiator, and a first substrate illustrating an exemplary method of connecting the data connection unit and the first substrate according to the principles of the invention.

Figure 9A:
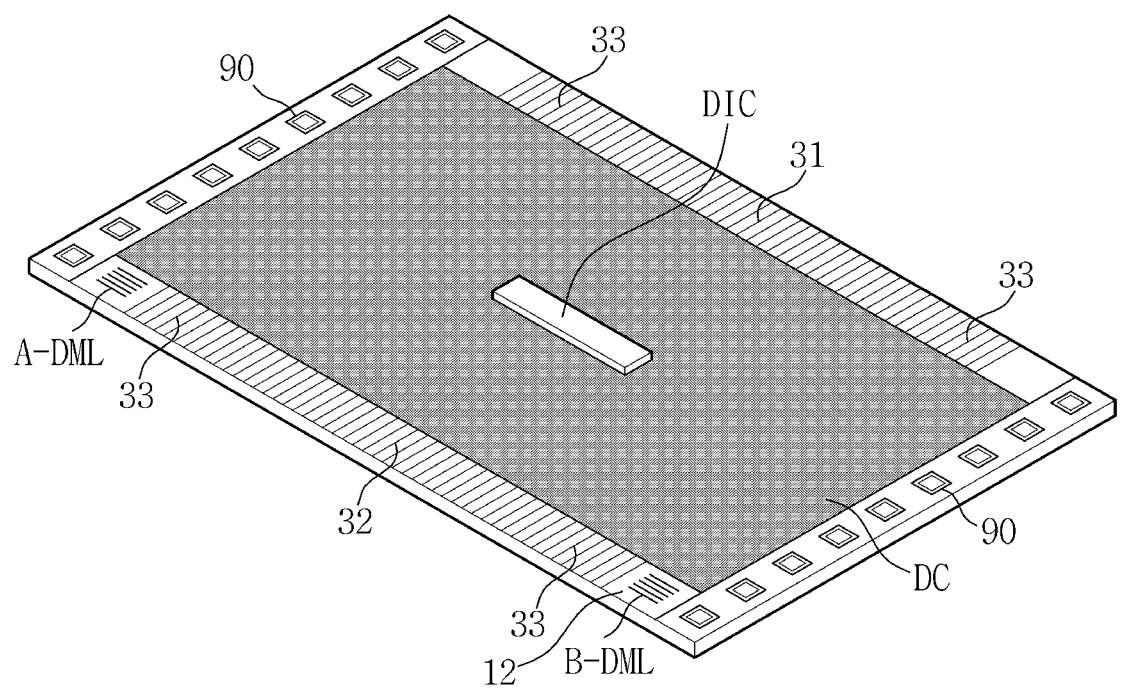
FIGS. 9A to 9H are schematic perspective views of a data connection unit, a support, a pressing apparatus, a first laser irradiator, a second laser irradiator, and a first substrate illustrating an exemplary method of connecting the data connection unit and the first substrate according to the principles of the invention.

First, as illustrated in FIG. 9A, the data connection unit DC including the data driving IC DIC is prepared. The data connection unit DC includes sprocket holes 90 on the opposing short side edges thereof.

Figure 9B:
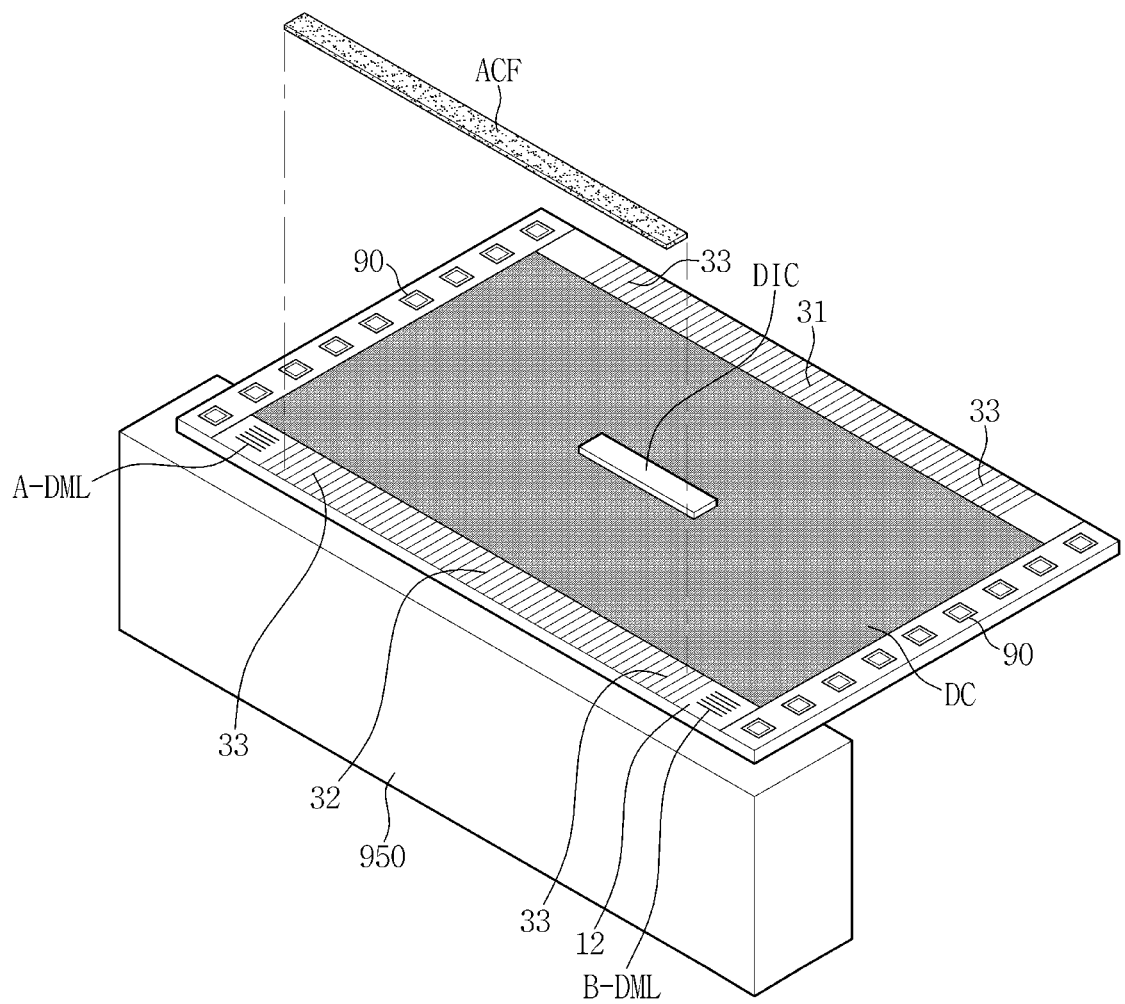

As illustrated in FIG. 9B, the data connection unit DC is disposed on a support 950. For example, an output portion 12 of the data connection unit DC is disposed on the support 950. In such an exemplary embodiment, a opposite surface of the output portion 12 contacts the support 950.

Subsequently, the ACF is placed on the output portion 12 of the data connection unit DC. The ACF has a length and a width suitable to overlap output lead lines exposed through the output portion 12. That is, in order to substantially minimize an amount of the ACF being used, the ACF has such a size as to overlap the output lead lines. In the case where the ACF has an area large enough to cover the entire surface of the output portion 12 of the data connection unit DC, an edge of the ACF may contact the support 950 and may contaminate the support 950.

Contamination of the support 950 may cause various problems including damage to the data connection unit DC. For example, the support 950 is used again in a main pressing process, which will be described subsequently. In such a case, in the case where the ACF remains on the support 950, the first substrate 301 on the support 950 may be bonded to the support 950 by the ACF. Then, a crack may occur in the first substrate 301 when the first substrate 301 is separated from the support 950.

For such various reasons, the ACF on the data connection unit DC has a smaller area than the area of the output portion 12 of the data connection unit DC.

Figure 9C:
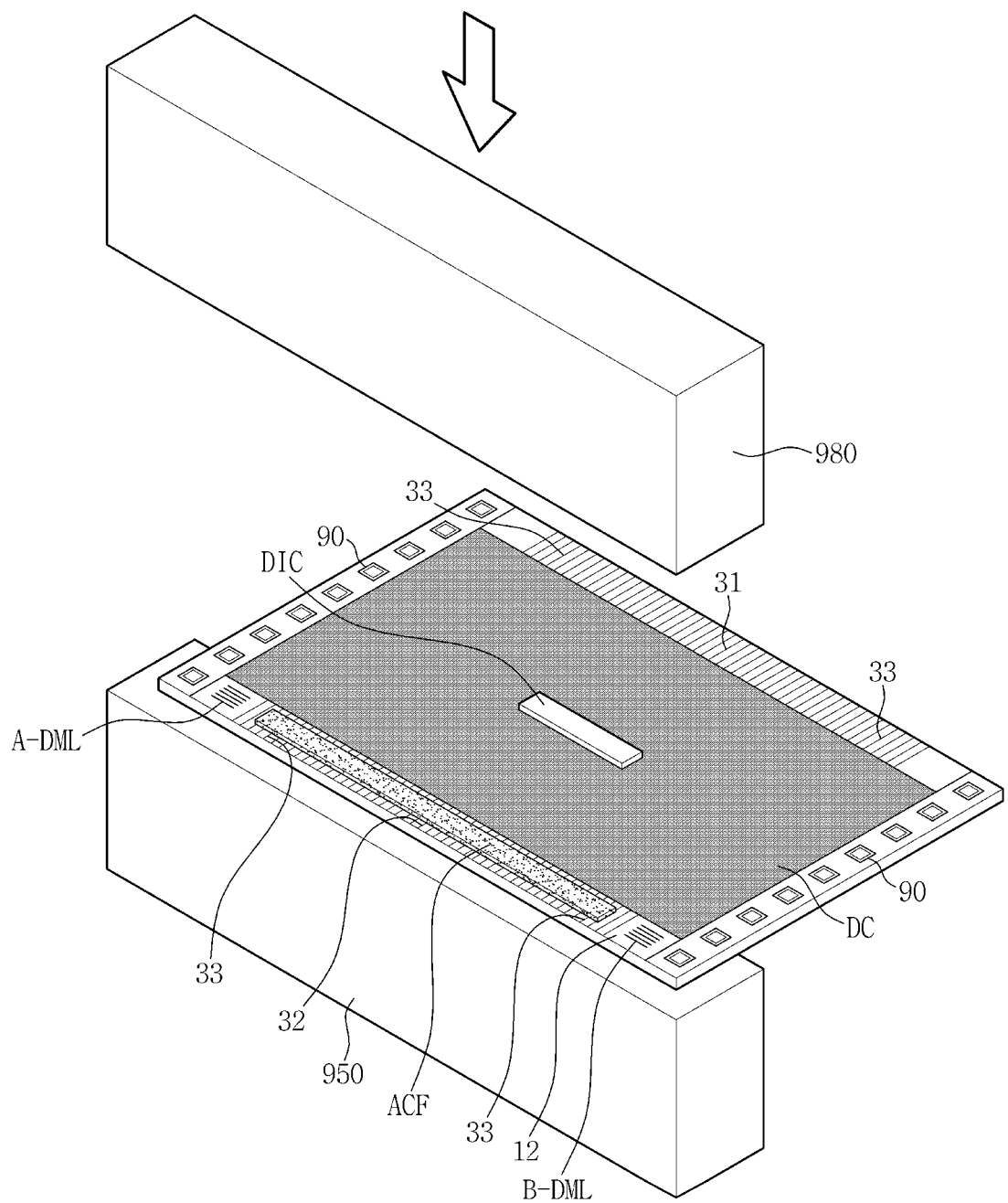

As illustrated in FIG. 9C, a pressing apparatus 980 is disposed above the ACF. Subsequently, the pressing apparatus 980 descends in the direction of an arrow toward the ACF to contact the ACF. In such a state, the pressing apparatus 980 exerts pressure on the ACF. The process illustrated in FIG. 9C is a preliminary pressing process, in which the ACF is weakly bonded to the data connection unit DC by the pressure applied in this process.

Figure 9D:
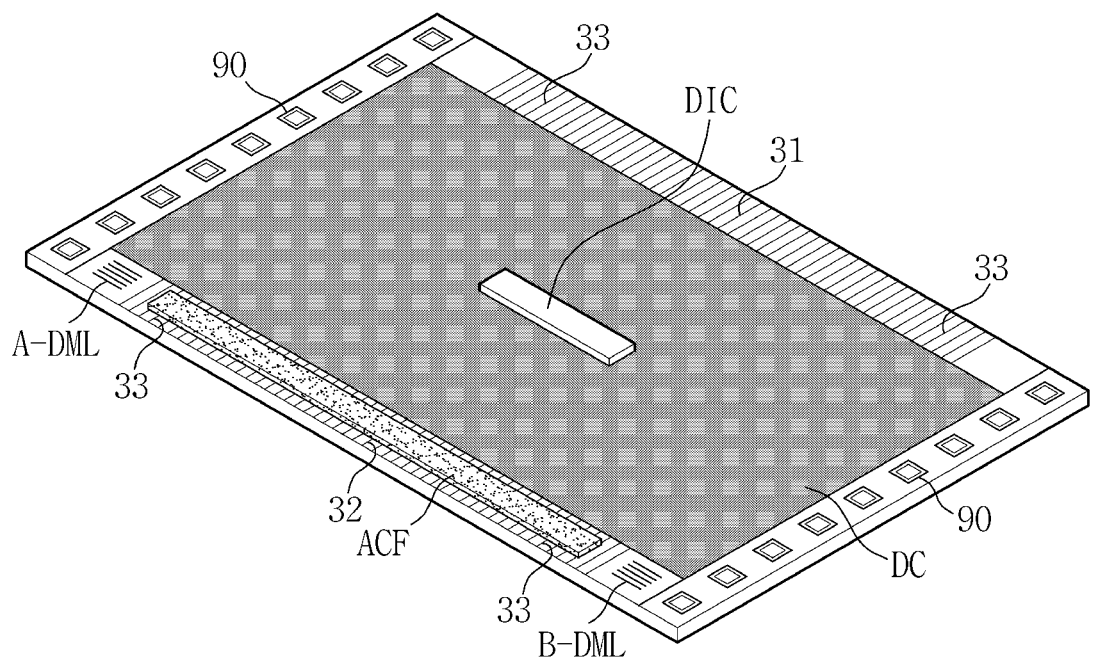

FIG. 9D is a perspective view illustrating the ACF bonded to the data connection unit DC by the preliminary pressing process of FIG. 9C.

Figure 9E:
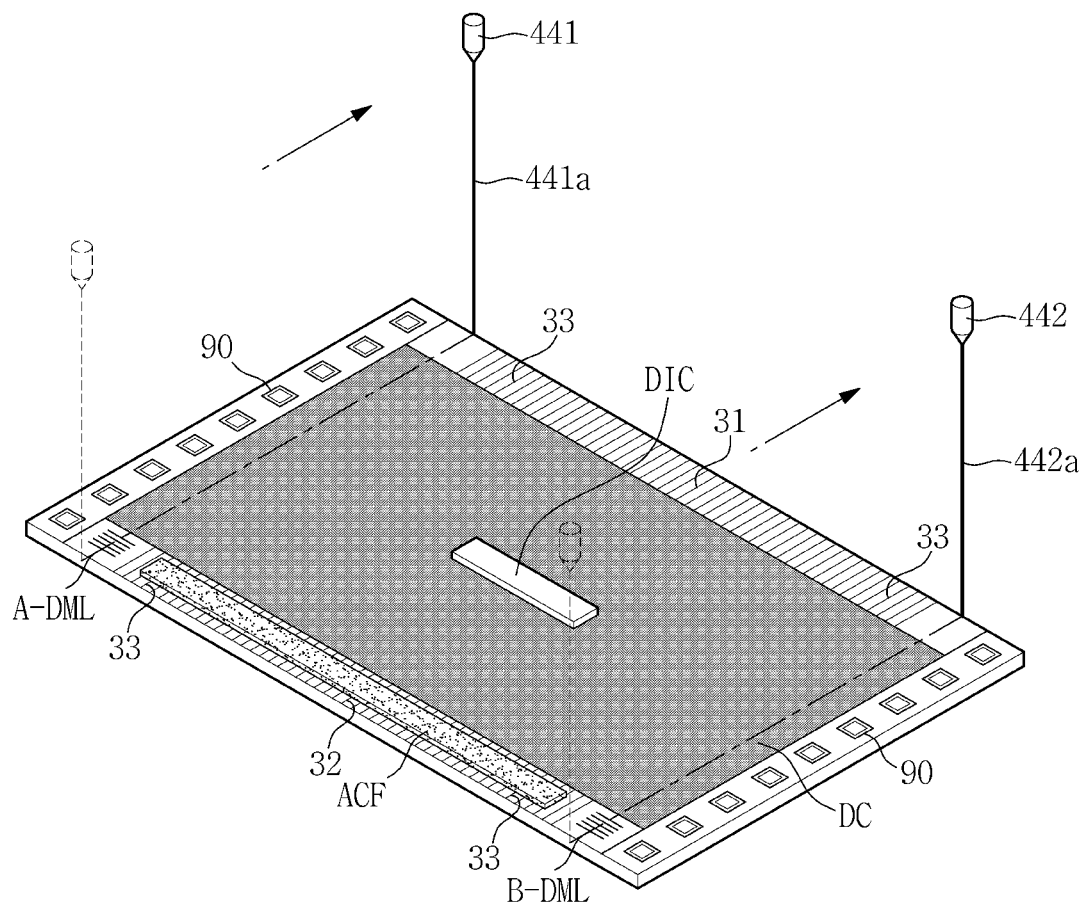

As illustrated in FIG. 9E, a cutting process of the data connection unit DC is performed. This cutting process may be performed by a laser irradiator. For example, a laser beam 441a irradiated from a first laser irradiator 441 moves in a direction (an arrow direction) substantially perpendicular to the A-dummy lines A-DML to cut the data connection unit DC. A laser beam 442a irradiated from a second laser irradiator 442 moves in a direction (the arrow direction) substantially perpendicular to the B-dummy lines B-DML to cut the data connection unit DC.

Figure 9F:
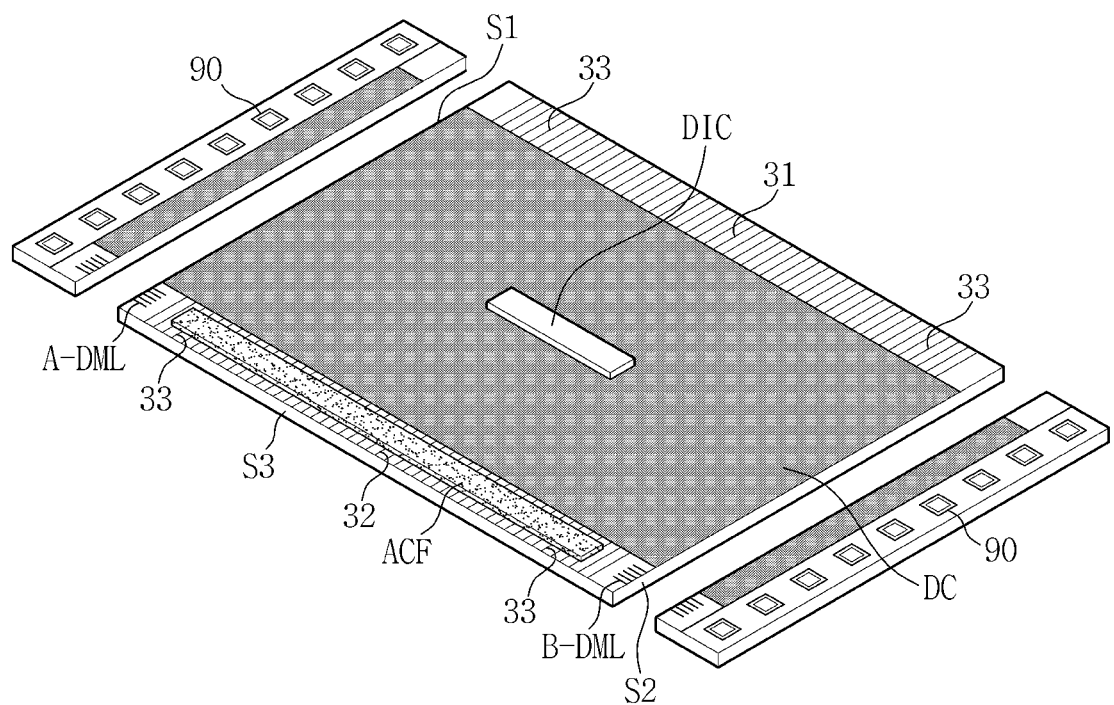

As illustrated in FIG. 9F, the both opposing short end portions of the data connection unit DC having the sprocket holes 90 are removed such that the data connection unit DC having the first side S1 and the second side S2 may be provided. In addition, as a portion of the A-dummy lines A-DML and a portion of the B-dummy lines B-DML are removed together by the cutting process, respective end portions of the A-dummy lines A-DML are positioned along the first side S1 and respective end portions of the B-dummy lines B-DML are positioned along the second side S2.

In such an exemplary embodiment, by the laser beams 441a and 442a, at least a portion of the end portion of the A-dummy line A-DML and at least a portion of the end portion of the B-dummy line B-DML are carbonized. Accordingly, the end portions of the A-dummy lines A-DML and the end portions of the B-dummy lines B-DML have a carbonized area.

Figure 9G:
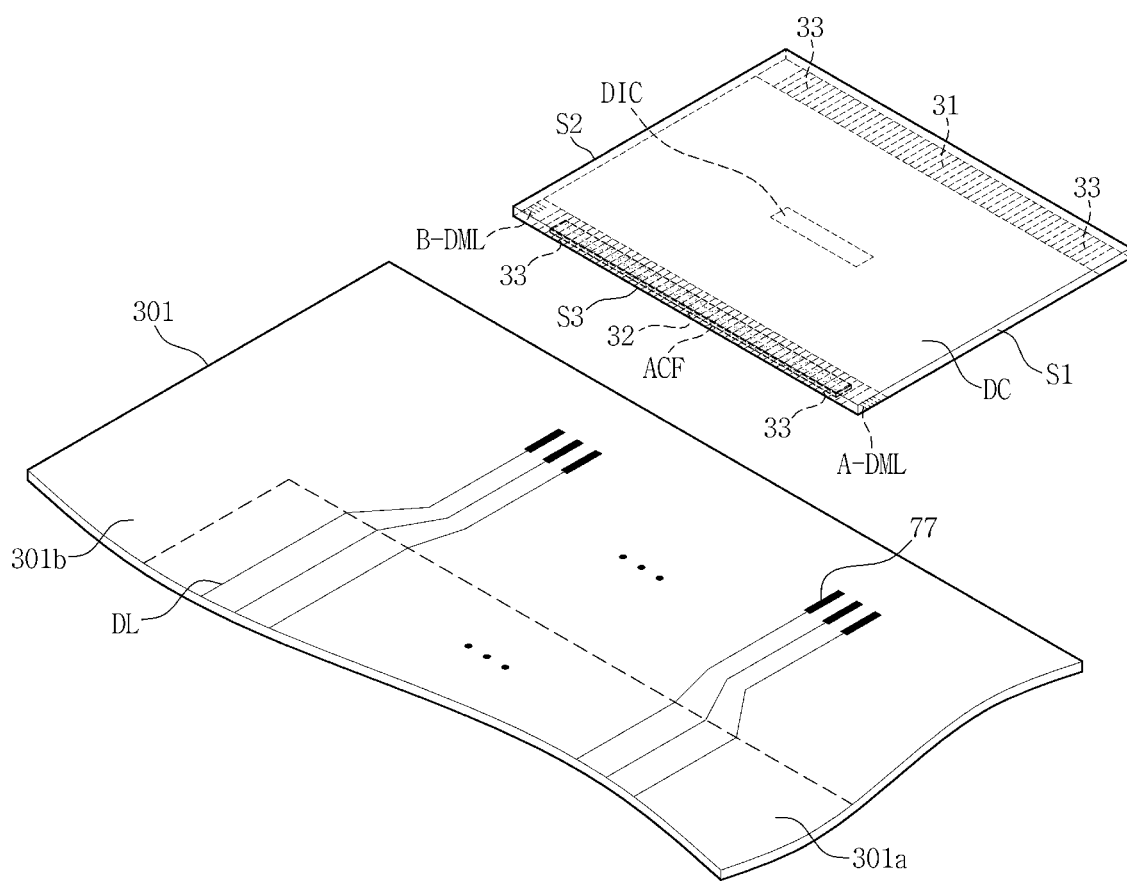

As illustrated in FIG. 9G, a connecting process between the data connection unit DC and the first substrate 301 is performed. To this end, the data connection unit DC of FIG. 9F is disposed above the first substrate 301, turned upside down as illustrated in FIG. 9G. Accordingly, as illustrated in FIG. 9G, the ACF on the data connection unit DC faces the first substrate 301. In such an exemplary embodiment, the ACF faces pad terminals 77 of the first substrate 301. The pad terminals 77 may include the data pad terminal of the first substrate 301 described above with reference to FIG. 1 to FIG. 4.

Figure 9H:
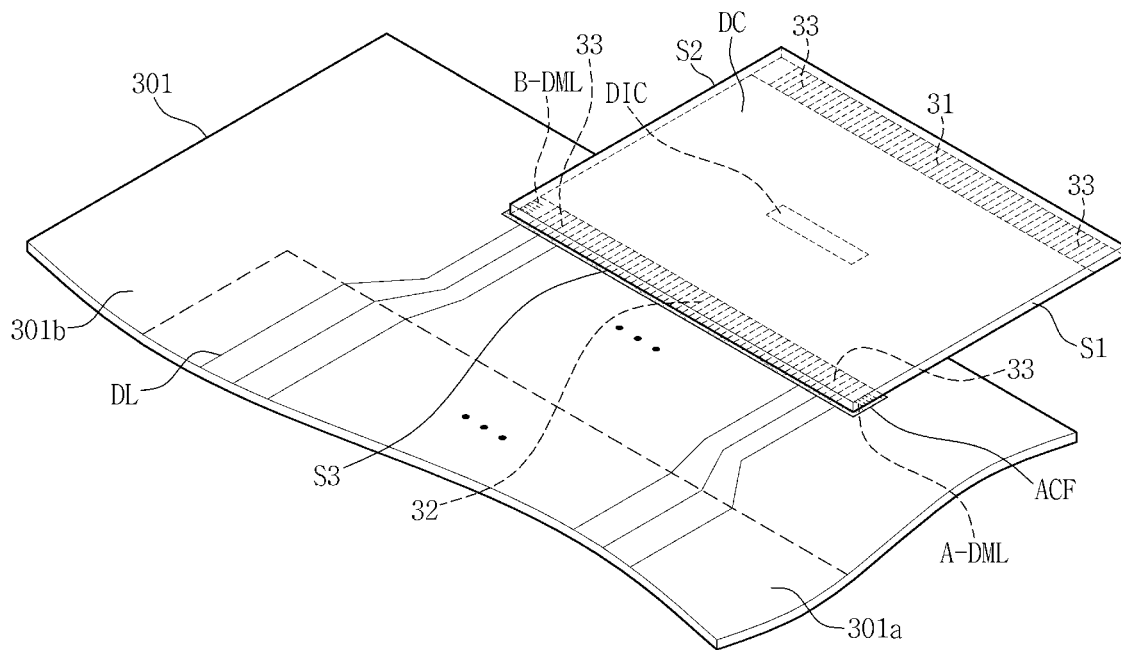

As illustrated in FIG. 9H, the data connection unit DC is electrically connected to the pad terminal 77 of the first substrate 301. In such an exemplary embodiment, the data connection unit DC is bonded to the first substrate 301 by the ACF.

Consequently, a bonded portion of the first substrate 301 and the data connection unit DC is disposed between the support 950 and the pressing apparatus 980. In such an exemplary embodiment, the support 950 is disposed below the first substrate 301 to face the first substrate 301, and the pressing apparatus 980 is disposed above the data connecting unit DC to face the data connecting unit DC.

Next, the pressing apparatus 980 descends toward the data connection unit DC to contact the data connection unit DC. In such a state, the pressing apparatus 980 applies pressure to the data connection unit DC. This process is the main pressing process, and the pressure applied in this main pressing process is higher than a pressure applied in the preliminary pressing process described above.

The ACF is firmly bonded to the data connection unit DC and the first substrate 301 by the pressure applied in the main pressing process. In an exemplary embodiment, heat may be further applied to the ACF during the main pressing process.

The viscosity of the ACF decreases in the main pressing process. Accordingly, the fluidity of the ACF increases. The ACF may smoothly move to one edge, i.e., the first side S1, of the data connection unit DC through the A-dummy lines A-DML and may smoothly move to another edge, i.e., the second side S2, of the data connection unit DC through the B-dummy lines B-DML. In such an exemplary embodiment, the ACF may be further spread and diffused through the first side S1, the second side S2, and the third side S3 of the data connection unit DC.

As the ACF is diffused by the A-dummy lines A-DML and the B-dummy lines B-DML in such a manner, the cured ACF may have a larger area than an area of the output portion 12 of the data connection unit DC as illustrated in FIG. 9H.

In an exemplary embodiment, as illustrated in FIGS. 9H and 7, the A-dummy lines A-DML are disposed between the first substrate 301 and the base layer 801 of the data connection unit DC. In such an exemplary embodiment, when the ACF is sufficiently diffused, the A-dummy lines A-DML may be disposed between the ACF and the base layer 801 of the data connection unit DC. Similarly, the B-dummy lines B-DML are disposed between the first substrate 301 and the base layer 801 of the data connection unit DC. In such an exemplary embodiment, when the ACF is sufficiently diffused, the B-dummy lines B-DML may be disposed between the ACF and the base layer 801 of the data connection unit DC.

As illustrated in FIG. 9H, the ACF may be disposed between the first substrate 301 and at least a portion of each A-dummy line A-DML. Similarly, the ACF may be disposed between the first substrate 301 and at least a portion of each B-dummy line B-DML.

As the ACF having a substantially minimum area may be smoothly moved to the edge of the data connection unit DC by the A-dummy lines A-DML and B-dummy lines B-DML, manufacturing costs may be reduced and the adhesion between the data connection unit DC and the first substrate 301 may be improved. In addition, since the ACF is formed onto both ends of the data connection unit DC, detachment of the data connection unit DC may be substantially prevented.

Figure 10:
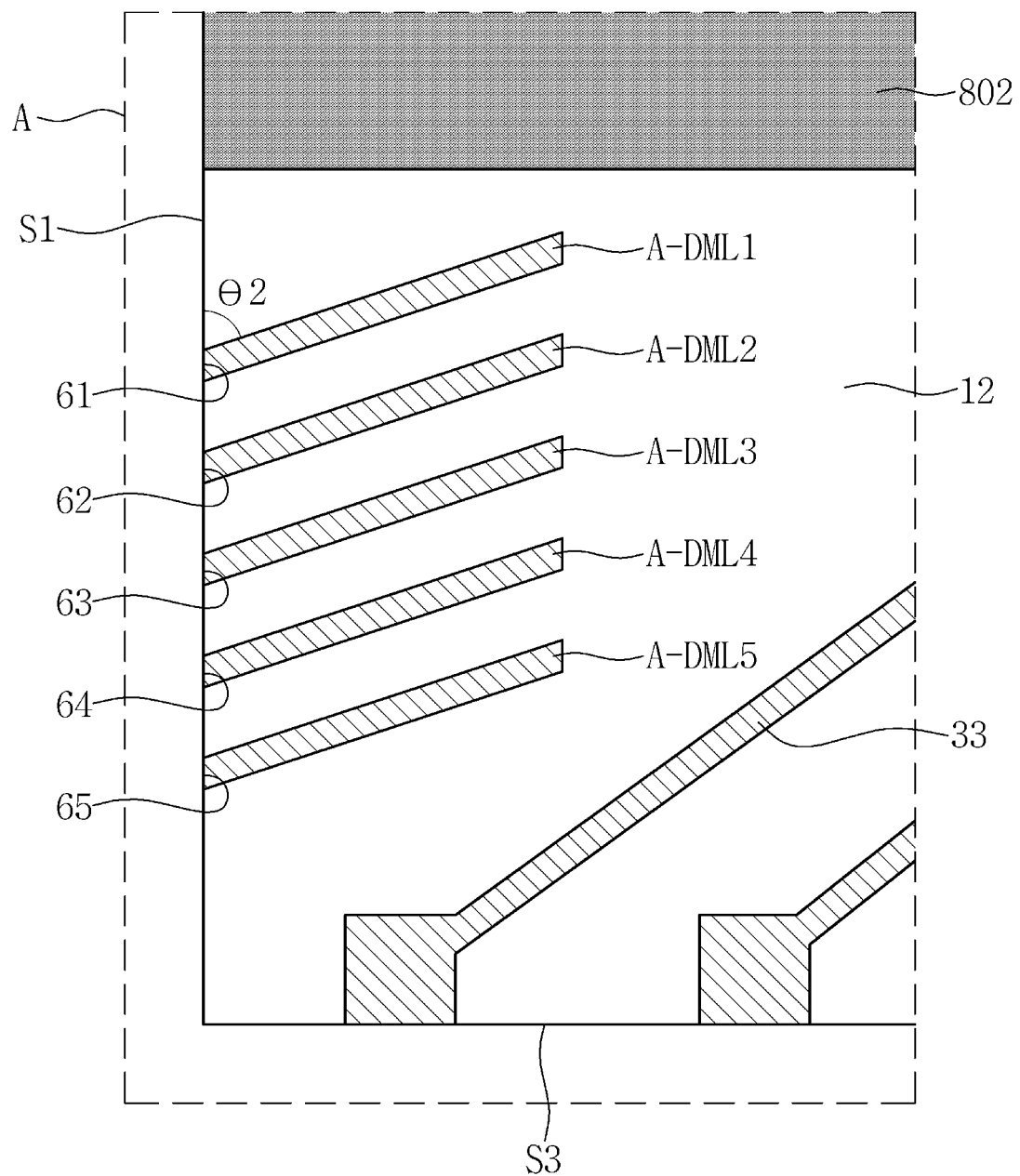
FIG. 10 is an enlarged schematic plan view of portion A of the data connection unit of FIG. 4 illustrating a second embodiment of dummy lines.

FIG. 10 is an enlarged schematic plan view of portion A of the data connection unit of FIG. 4 illustrating a second embodiment of dummy lines.

As illustrated in FIG. 10, A-dummy lines A-DML1, A-DML2, A-DML3, A-DML4, and A-DML5 have end portions 61, 62, 63, 64, and 65 disposed in different positions of the first side S1. The A-dummy lines A-DML have a shape extending upwardly from the first side S1 toward a second side S2.

The angle between each of the A-dummy lines A-DML1, A-DML2, A-DML3, A-DML4, and A-DML5 and the first side S1 may be greater than about 0 degrees and less than about 90 degrees. For example, as illustrated in FIG. 10, an acute angle θ2 between the first A-dummy line A-DML1 and the first side S1 may be greater than about 0 degrees and less than about 90 degrees.

At least two of the A-dummy lines may have different slopes. For example, an angle between the first A-dummy line A-DML1 and the first side S1 may be different from an angle between the second A-dummy line A-DML2 and the first side S1.

The B-dummy lines B-DML may have substantially the same shape as the shape of the A-dummy lines A-DML1, A-DML2, A-DML3, A-DML4, and A-DML5 in FIG. 10. For example, an acute angle of angle between each of the B-dummy linen B-DML and the second side S2 may be greater than about 0 degrees and less than about 90 degrees.

The B-dummy lines B-DML and the A-dummy lines A-DML1, A-DML2, A-DML3, A-DML4, and A-DML5 of FIG. 10 may be symmetrically arranged to one another. For example, assuming an imaginary line passing through the center of a third side S3 of the data connection unit DC and perpendicularly intersecting the third side S3, the B-dummy lines B-DML and the A-dummy lines A-DML1, A-DML2, A-DML3, A-DML4, and A-DML5 may be axially symmetric with respect to the imaginary line.

At least one of the A-dummy lines A-DML1, A-DML2, A-DML3, A-DML4, and A-DML5 and at least one of the B-dummy lines B-DML may have different slopes.

Based on the structure of the A-dummy lines A-DML1, A-DML2, A-DML3, A-DML4, and A-DML5 illustrated in FIG. 10, the ACF may be smoothly diffused in directions toward the first side S1, the second side S2, and the third side S3.

Based on the structure of the A-dummy lines A-DML1, A-DML2, A-DML3, A-DML4, and A-DML5 illustrated in FIG. 10, diffusion force of the A-dummy lines A-DML1, A-DML2, A-DML3, A-DML4, and A-DML5 exerted on the ACF in the direction of the first side S1 is reduced from that in the structure illustrated in FIG. 6, such that the ACF may be smoothly diffused in directions toward the first side S1, the second side S2, and the third side S3.

Figure 11:
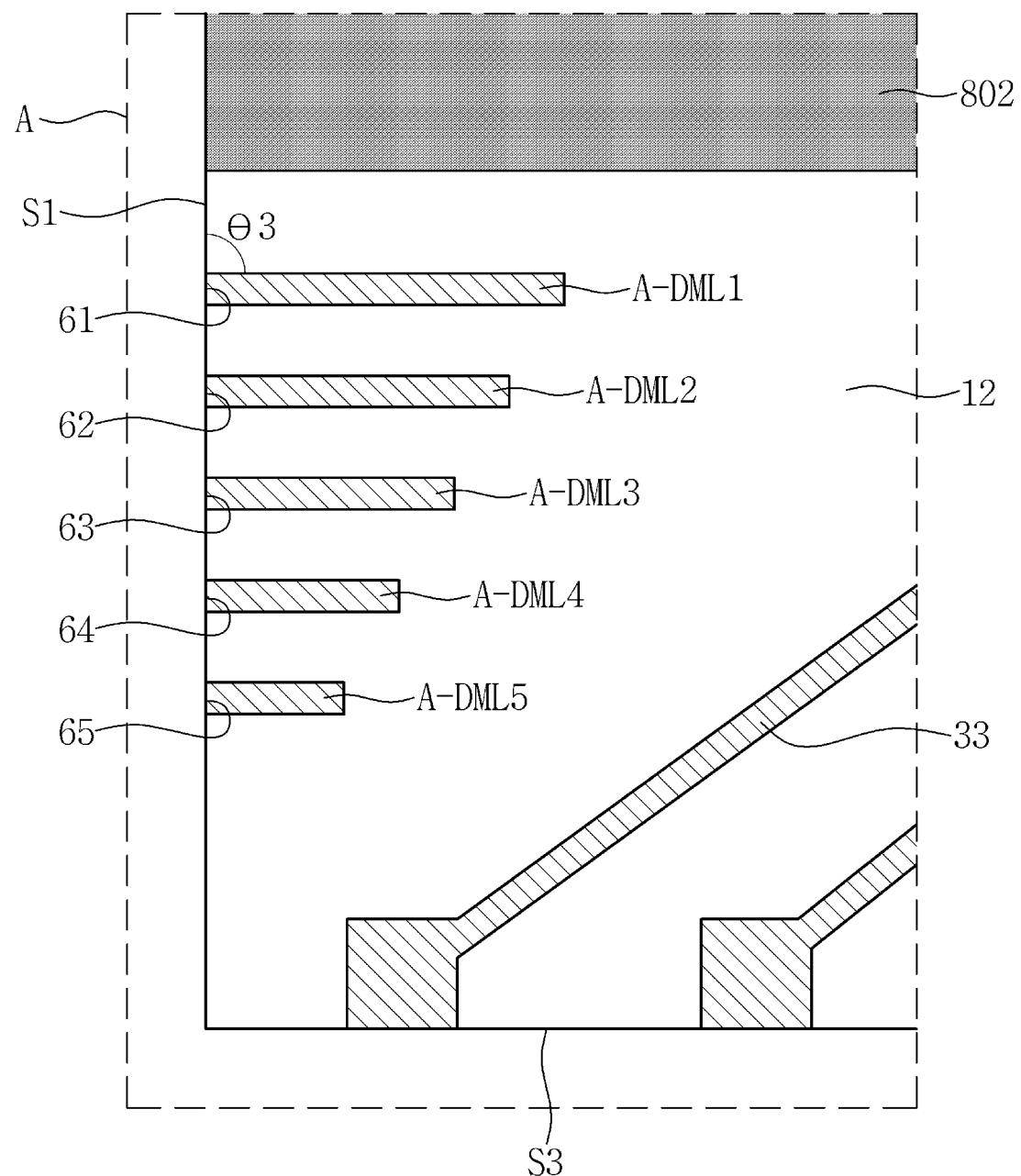
FIG. 11 is an enlarged schematic plan view of portion A of the data connection unit of FIG. 4 illustrating a third embodiment of dummy lines.

FIG. 11 is an enlarged schematic plan view of portion A of the data connection unit of FIG. 4 illustrating a third embodiment of dummy lines.

As illustrated in FIG. 11, A-dummy lines A-DML1, A-DML2, A-DML3, A-DML4, and A-DML5 have end portions 61, 62, 63, 64, and 65 disposed at different portions of a first side S1. In addition, the A-dummy lines A-DML1, A-DML2, A-DML3, A-DML4, and A-DML5 have a shape extending from the first side S1 toward a second side S2.

An angle $\theta 3$ between each of the A-dummy lines A-DML1, A-DML2, A-DML3, A-DML4, and A-DML5 and the first side S1 may be about 90 degrees.

As illustrated in FIG. 11, the A-dummy lines A-DML1, A-DML2, A-DML3, A-DML4, and A-DML5 may have a decreasing length, as they approach third side S3. For example, among the A-dummy lines A-DML1, A-DML2, A-DML3, A-DML4, and A-DML5, the first A-dummy line A-DML1 disposed farthest from the third side S3 has a longest length, and the fifth A-dummy line A-DML5 disposed closest to the third side S3 has a shortest length. In addition, the second A-dummy line A-DML2 has a length less than that of the first A-dummy line A-DML1 and longer than that of the third A-dummy line A-DML3, the third A-dummy line A-DML3 has a length less than that of the second A-dummy line A-DML2 and longer than that of the fourth A-dummy line A-DML4, and the fourth A-dummy line A-DML4 has a length less than that of the third A-dummy line A-DML3 and longer than that of the fifth A-dummy line A-DML5.

The B-dummy lines B-DML may have substantially the same shape as the shape of the A-dummy lines A-DML1, A-DML2, A-DML3, A-DML4, and A-DML5 illustrated in FIG. 11. For example, the B-dummy lines B-DML may have a decreasing length, as they approach the third side S3.

The B-dummy lines B-DML and the A-dummy lines A-DML1, A-DML2, A-DML3, A-DML4, and A-DML5 of FIG. 11 may be symmetrically arranged to one another. For example, the B-dummy lines B-DML and the A-dummy lines A-DML1, A-DML2, A-DML3, A-DML4, and A-DML5 may be axially symmetric with respect to the imaginary line described above with reference to FIG. 10.

Based on the structure of the A-dummy lines A-DML1, A-DML2, A-DML3, A-DML4, and A-DML5 illustrated in FIG. 11, the diffusion force of the A-dummy lines A-DML1, A-DML2, A-DML3, A-DML4, and A-DML5 exerted to the ACF in the direction of the first side S1 is gradually reduced as they approach the third side S3. Thus, the ACF may be smoothly diffused in directions toward the first side S1, the second side S2, and the third side S3.

The A-dummy lines A-DML1, A-DML2, A-DML3, A-DML4, and A-DML5 may have a greater length, as they approach the third side S3. Similarly, the B-dummy lines B-DML may have a greater length, as they approach the third side S3.

Figure 12:
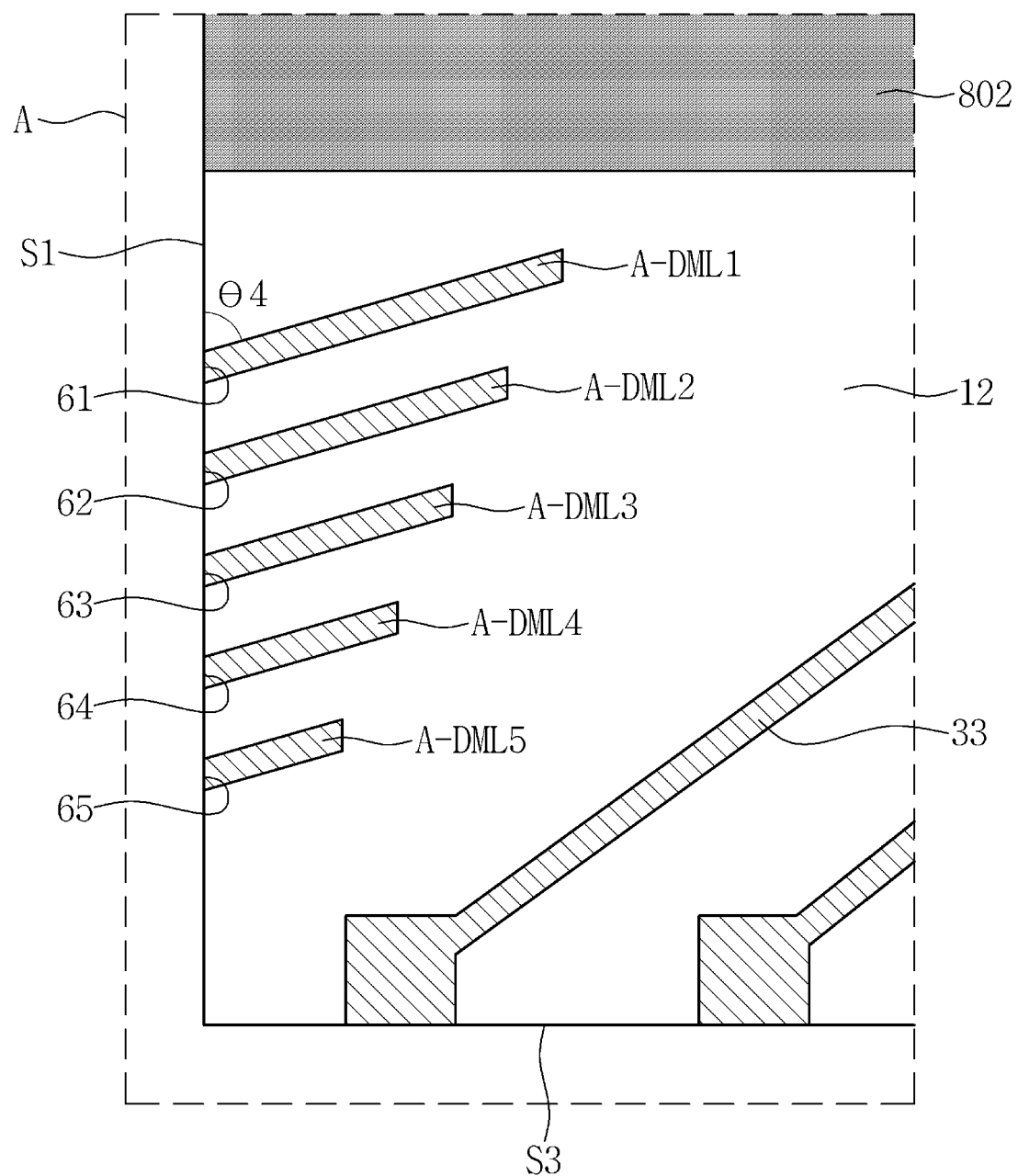
FIG. 12 is an enlarged schematic plan view of portion A of the data connection unit of FIG. 4 illustrating a fourth embodiment of dummy lines.

FIG. 12 is an enlarged schematic plan view of portion A of the data connection unit of FIG. 4 illustrating a fourth embodiment of dummy lines.

As illustrated in FIG. 12, A-dummy lines A-DML1, A-DML2, A-DML3, A-DML4, and A-DML5 have end portions 61, 62, 63, 64, and 65 disposed at different portions of a first side S1. The A-dummy lines A-DML1, A-DML2, A-DML3, A-DML4, and A-DML5 have a shape extending from the first side S1 toward a second side S2.

Similar to the configuration illustrated in FIG. 10, respective angles among the first side S1 and the A-dummy lines A-DML1, A-DML2, A-DML3, A-DML4, and A-DML5 of FIG. 12 may be greater than about 0 degrees and less than about 90 degrees. For example, as illustrated in FIG. 12, an acute angle $\theta 4$ between the first A-dummy line A-DML1 and the first side S1 may be greater than about 0 degrees and less than about 90 degrees.

In addition, similar to the configuration illustrated in FIG. 11, the A-dummy lines A-DML1, A-DML2, A-DML3, A-DML4, and A-DML5 of FIG. 12 may decrease in length, as they approach third side S3. For example, among the A-dummy lines A-DML1, A-DML2, A-DML3, A-DML4, and A-DML5, the first A-dummy line A-DML1 disposed farthest from the third side S3 has the longest length, and the fifth A-dummy line A-DML5 disposed closest to the third side S3 has the shortest length.

B-dummy lines B-DML may have substantially the same shape as the shape of the A-dummy lines A-DML1, A-DML2, A-DML3, A-DML4, and A-DML5 of FIG. 12. For example, an acute angle between each of the B-dummy lines B-DML and the second side S2 may be greater than about 0 degrees and less than about 90 degrees. In addition, the B-dummy lines B-DML may decrease in length, as they approach the third side S3.

The B-dummy lines B-DML and the A-dummy lines A-DML1, A-DML2, A-DML3, A-DML4, and A-DML5 of FIG. 12 may be symmetrically arranged to one another. For example, the B-dummy lines B-DML and the A-dummy lines A-DML1, A-DML2, A-DML3, A-DML4, and A-DML5 may be axially symmetric with respect to the imaginary line described above with reference to FIG. 10.

Based on the structure of the A-dummy lines A-DML1, A-DML2, A-DML3, A-DML4, and A-DML5 illustrated in FIG. 12, the diffusion force of the A-dummy lines A-DML1, A-DML2, A-DML3, A-DML4, and A-DML5 exerted to the ACF in the direction of the first side S1 decreases as they approach the third side S3. Thus, the ACF may be smoothly diffused in directions toward the first side S1, the second side S2, and the third side S3.

The A-dummy lines A-DML1, A-DML2, A-DML3, A-DML4, and A-DML5 may have a longer length, as they approach the third side S3. Similarly, the B-dummy lines B-DML may have a longer length, as they approach the third side S3.

Figure 13:
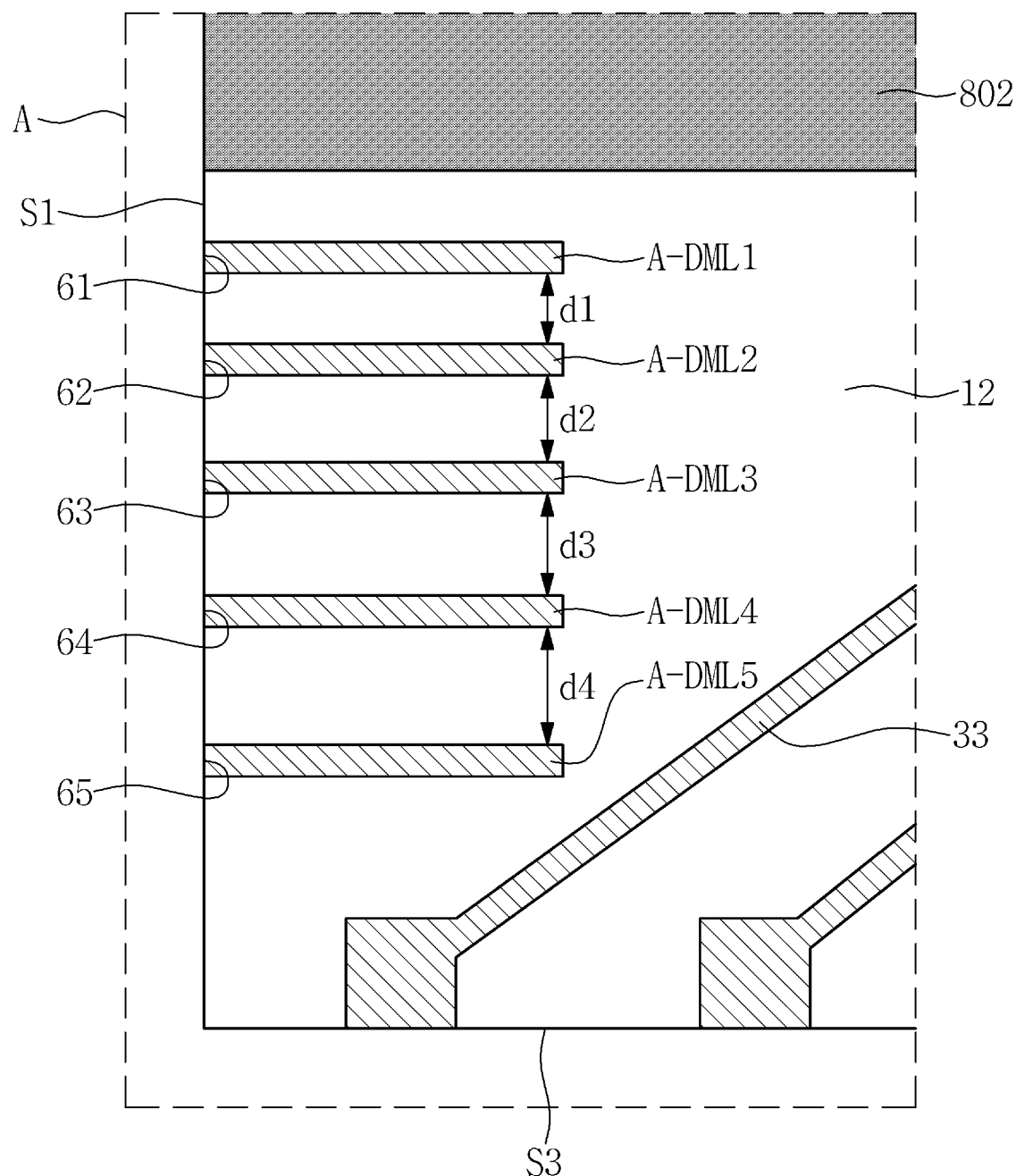
FIG. 13 is an enlarged schematic plan view of portion A of the data connection unit of FIG. 4 illustrating a fifth embodiment of dummy lines.

FIG. 13 is an enlarged schematic plan view of portion A of the data connection unit of FIG. 4 illustrating a fifth embodiment of dummy lines.

As illustrated in FIG. 13, A-dummy lines A-DML1, A-DML2, A-DML3, A-DML4, and A-DML5 have end portions 61, 62, 63, 64, and 65 disposed at different portions of a first side S1. The A-dummy lines A-DML have a shape extending from the first side S1 toward a second side S2.

As illustrated in FIG. 13, two adjacent ones of the A-dummy lines A-DML1, A-DML2, A-DML3, A-DML4, and A-DML5 may have a greater distance therebetween, as they are closer to third side S3. For example, a distance d1 between the first A-dummy line A-DML1 disposed farthest from the third side S3 and the second A-dummy line A-DML2 adjacent to the first A-dummy line A-DML1 is the smallest, and a distance d4 between the fifth A-dummy line A-DML5 disposed closest to the third side S3 and the fourth A-dummy line A-DML4 adjacent to the fifth A-dummy line A-DML5 is the greatest. Further, the distance d2 between the second A-dummy line A-DML2 and the third A-dummy line A-DML3 adjacent to the second A-dummy line A-DML2 is less than the distance d3 between the third A-dummy line A-DML3 and the fourth A-dummy line A-DML4 adjacent to the third A-dummy line A-DML3.

B-dummy lines B-DML may have substantially the same shape as the shape of the A-dummy lines A-DML1, A-DML2, A-DML3, A-DML4, and A-DML5 in FIG. 13. For example, two adjacent ones of the B-dummy lines B-DML may be spaced at a greater distance, as they approach the third side S3.

The B-dummy lines B-DML and the A-dummy lines A-DML1, A-DML2, A-DML3, A-DML4, and A-DML5 of FIG. 13 may be symmetrically arranged to one another. For example, the B-dummy lines B-DML and the A-dummy lines A-DML1, A-DML2, A-DML3, A-DML4, and A-DML5 may be axially symmetric with respect to the imaginary line described above with reference to FIG. 10.

Based on the structure of the A-dummy lines A-DML1, A-DML2, A-DML3, A-DML4, and A-DML5 illustrated in FIG. 13, respective diffusion forces of the A-dummy lines A-DML1, A-DML2, A-DML3, A-DML4, and A-DML5 exerted on the ACF in the direction of the first side S1 are different from one another. For example, as the distance between the first A-dummy line A-DML1 and the second A-dummy line A-DML2 is relatively narrow, the diffusion speed of the ACF passing between them is relatively high. On the other hand, as the distance between the fourth A-dummy line A-DML4 and the fifth A-dummy line A-DML5 is relatively wide, the diffusion speed of the ACF passing between them is relatively low.

Two adjacent ones of the A-dummy lines A-DML1, A-DML2, A-DML3, A-DML4, and A-DML5 may have less distance therebetween, as they approach the third side S3. Similarly, two adjacent ones of the B-dummy lines B-DML may have less distance therebetween, as they approach the third side S3.

Figure 14:
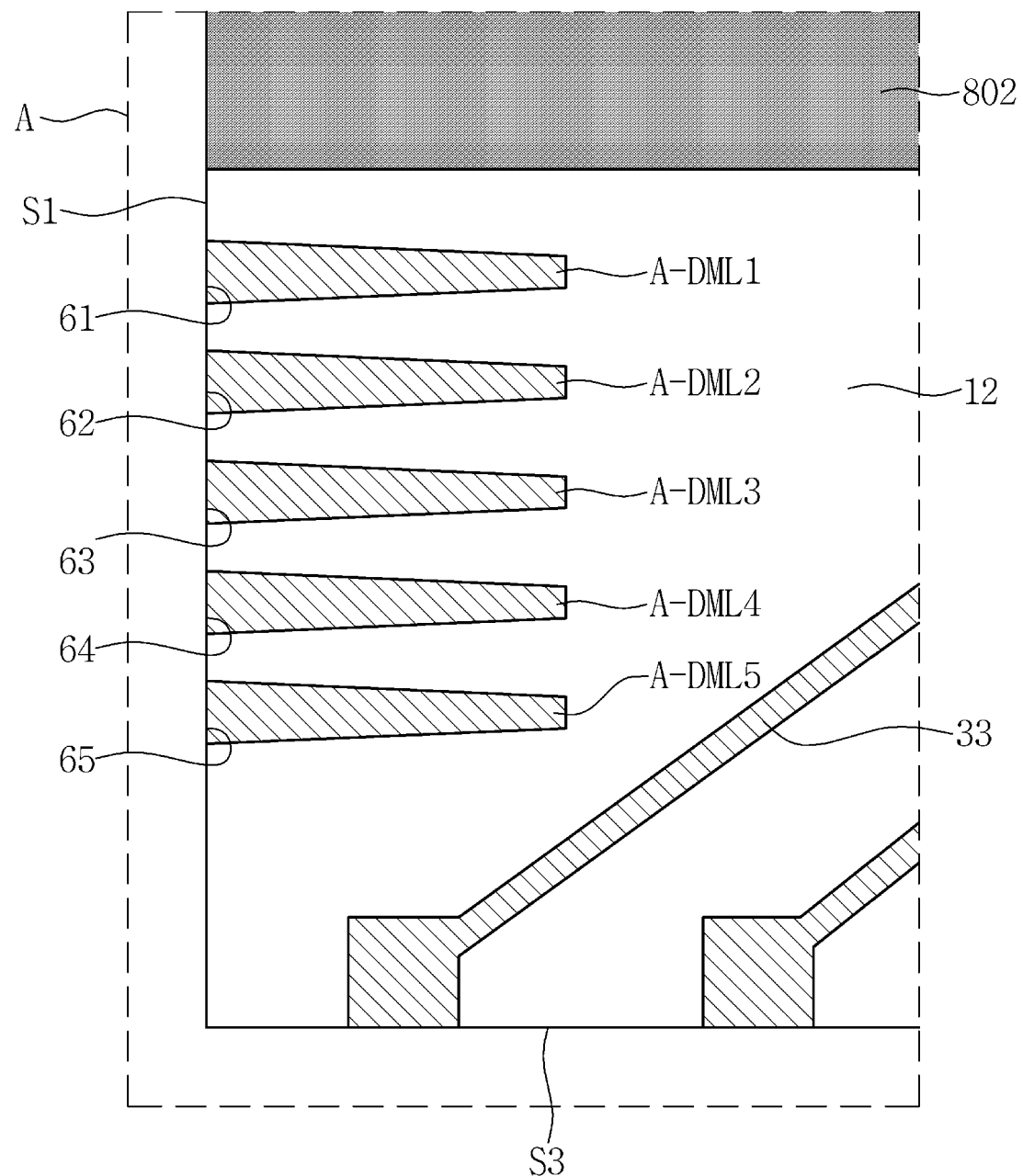
FIG. 14 is an enlarged schematic plan view of portion A of the data connection unit of FIG. 4 illustrating a first embodiment of dummy lines.

FIG. 14 is an enlarged schematic plan view of portion A of the data connection unit of FIG. 4 illustrating a first embodiment of dummy lines.

As illustrated in FIG. 14, A-dummy lines A-DML1, A-DML2, A-DML3, A-DML4, and A-DML5 have end portions 61, 62, 63, 64, and 65 disposed at different portions of a first side S1 than the prior embodiments. In addition, the A-dummy lines A-DML1, A-DML2, A-DML3, A-DML4, and A-DML5 have a shape extending from the first side S1 toward a second side S2.

As illustrated in FIG. 14, each of the A-dummy lines A-DML1, A-DML2, A-DML3, A-DML4, and A-DML5 may have a width that gradually decreases in a direction further away from the first side S1. For example, the width of the first A-dummy line A-DML1 is greatest at the end portion 61 thereof and smallest at the other end portion opposite the end portion 61.

B-dummy lines B-DML may have substantially the same shape as the shape of the A-dummy lines A-DML1, A-DML2, A-DML3, A-DML4, and A-DML5 in FIG. 14. For example, each of the B-dummy lines B-DML may have a width that gradually decreases in a direction further away from the second side S2.

The B-dummy lines B-DML and the A-dummy lines A-DML1, A-DML2, A-DML3, A-DML4, and A-DML5 of FIG. 14 may be symmetrically arranged to one another. For example, the B-dummy lines B-DML and the A-dummy lines A-DML1, A-DML2, A-DML3, A-DML4, and A-DML5 may be axially symmetric with respect to the imaginary line described above with reference to FIG. 10.

Based on the structure of the A-dummy lines A-DML1, A-DML2, A-DML3, A-DML4, and A-DML5 illustrated in FIG. 14, the diffusion force of the A-dummy lines A-DML1, A-DML2, A-DML3, A-DML4, and A-DML5 exerted to the ACF in the direction of the first side S1 gradually increases as they approach the first side S1.

Alternatively, each of the A-dummy lines A-DML1, A-DML2, A-DML3, A-DML4, and A-DML5 may have a width that gradually increases in a direction further away from the first side S1. Similarly, each of the B-dummy lines B-DML may have a width that gradually increases in a direction further away from the second side S2.

In addition, at least one gate connection unit GC of FIG. 1 may further include the A-dummy lines A-DML1, A-DML2, A-DML3, A-DML4, and A-DML5 and the B-dummy lines B-DML.

Figure 15:
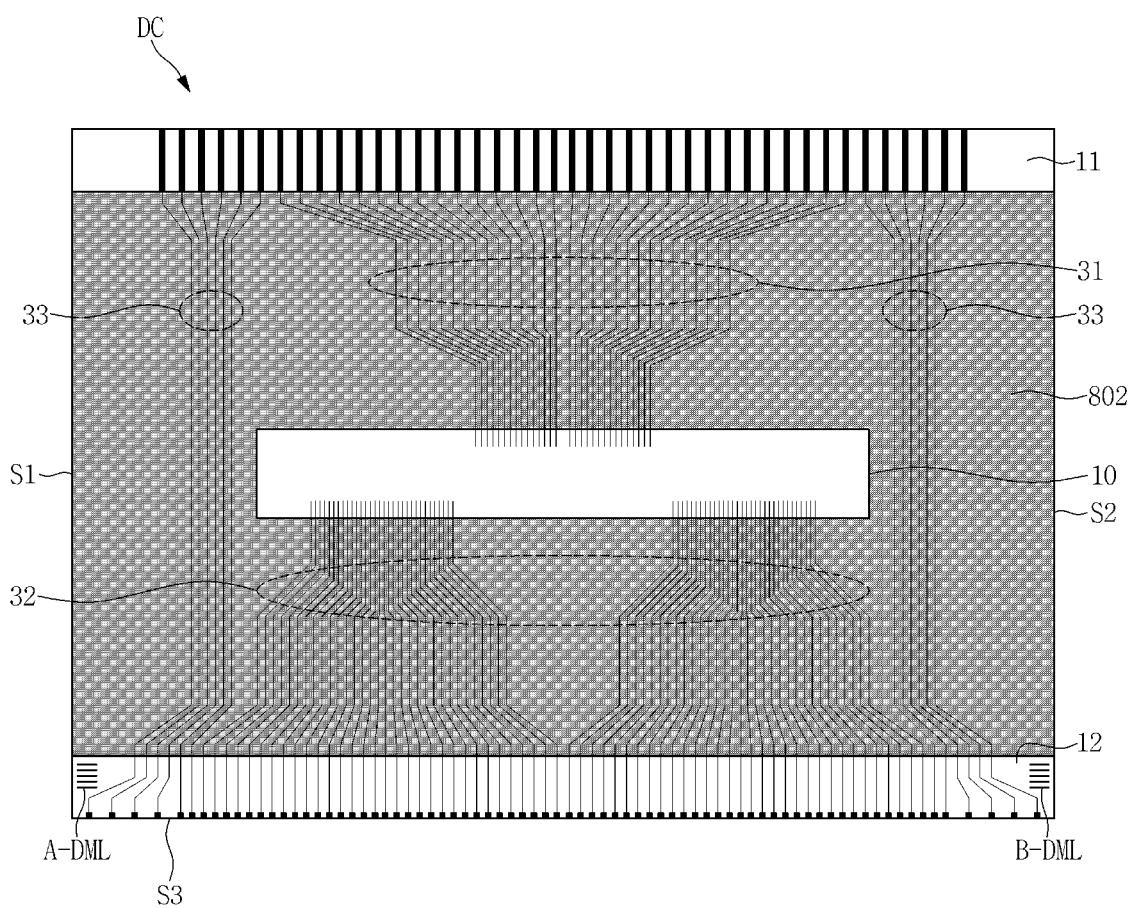
FIG. 15 is a detailed configuration view of another embodiment of a data connection unit of the first substrate of FIG. 2.

FIG. 15 is a detailed configuration view of another embodiment of a data connection unit of the first substrate of FIG. 2. Descriptions of like components are not repeated to avoid redundancy.

As illustrated in FIG. 15, each of A-dummy lines A-DML may be spaced apart from first side S1 at a predetermined distance. For example, an end portion of at least one A-dummy line A-DML may be spaced apart at a predetermined distance from the first side S1.

In addition, as illustrated in FIG. 15, each of B-dummy lines B-DML may be spaced apart from second side S2 at a predetermined distance. For example, an end portion of at least one B-dummy line B-DML may be spaced apart at a predetermined distance from the second side S2.

In an exemplary embodiment, the A-dummy lines A-DML and the B-dummy lines B-DML of FIG. 15 may have any one of the shapes illustrated in FIGS. 10, 11, 12, 13, and 14 described above.

As set forth above, according to one or more exemplary embodiments, the display device may provide the following effects. First, since the ACF having a substantially minimum area may smoothly move to an edge of the connection unit, manufacturing costs may be reduced and the adhesiveness between the connection unit and the substrate may be improved.

In addition, since the ACF is normally formed onto opposite ends of the connection unit, detachment of the data connection unit may be substantially prevented.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a substrate;
   a pixel connected to a gate line and a data line on the substrate;
   a connection unit connected to one of the gate line and the data line of the substrate; and
   a driving integrated circuit mounted on the connection unit,
   wherein the connection unit comprises:
   a lead line connected to the driving integrated circuit; and
   a first dummy line adjacent to a first side of the connection unit, the first side intersecting a side of the substrate, the first side extending in a first direction, the first dummy line extending in a second direction intersecting the first direction,
      wherein the side of the substrate overlaps the connection unit,
      wherein a third side of the connection unit overlaps the substrate without intersecting the side of the substrate, the third side extending in the second direction, and
      wherein the first dummy line is disposed in an area defined by the side of the substrate, the third side of the connection unit, the first side of the connection unit and a second side of the connection unit, the second side facing the first side.

2. The display device as claimed in claim 1, wherein the first dummy line has an end portion at the first side of the connection unit.

3. The display device as claimed in claim 2, wherein the first dummy line extends from the first side of the connection unit toward another side of the connection unit.

4. The display device as claimed in claim 2, wherein an angle between the first dummy line and the first side of the connection unit is about 90 degrees.

5. The display device as claimed in claim 2, wherein the smallest angle of respective angles among the first dummy lines and the first side of the connection unit is greater than about 0 degree and less than about 90 degrees.

6. The display device as claimed in claim 1, wherein the first dummy line is between the substrate and a base layer of the connection unit.

7. The display device as claimed in claim 1, wherein an entire surface of the first dummy line facing the substrate is not covered by a cover layer of the connection unit.

8. The display device as claimed in claim 1, further comprising an anisotropic conductive film between at least a portion of the first dummy line and the substrate.

9. The display device as claimed in claim 1, wherein the first dummy line comprises a plurality of first lines, the plurality of first lines not being connected to one another.

10. The display device as claimed in claim 1, wherein the first dummy line comprises a plurality of first lines, the plurality of first lines being substantially parallel to one another.

11. The display device as claimed in claim 1, wherein the first dummy line comprises a plurality of first lines, each of the first lines having substantially the same length.

12. The display device as claimed in claim 1, wherein the first dummy line comprises a plurality of first lines, the plurality of first lines having a reduced length, as the first lines become closer to the third side of the connection unit.

13. The display device as claimed in claim 1, wherein the first dummy line comprises a plurality of first lines, two adjacent ones of the first lines having a greater distance therebetween, as the first lines become closer to the third side of the connection unit.

14. The display device as claimed in claim 1, wherein the first dummy line comprises a plurality of first lines, the plurality of first lines having a gradually decreasing width, as the first lines become further away from the first side.

15. The display device as claimed in claim 1, wherein the first dummy line comprises a plurality of first lines, with respective distances among adjacent ones of the first lines being substantially uniform.

16. The display device as claimed in claim 1, wherein the first dummy line is not connected to the driving integrated circuit nor the lead line.

17. The display device as claimed in claim 2, wherein at least a portion of the end portion of the first dummy line comprises a carbonized area.

18. The display device as claimed in claim 1, wherein an end portion of the first dummy line is spaced apart from the first side at a predetermined distance.

19. The display device as claimed in claim 1, further comprising a second dummy line adjacent to the second side, the second dummy line not being connected to any line of the connection unit comprising the driving integrated circuit and the lead line.

20. The display device as claimed in claim 19, wherein the second dummy line and the first dummy line are substantially symmetrical to one another in shape.

* * * * *